US012754348B2

(12) United States Patent
Taniyama et al.

(10) Patent No.: US 12,754,348 B2
(45) Date of Patent: Oct. 6, 2026

(54) LAMINATION FILM FOR LIQUID CRYSTAL POLARIZING MEMBRANE, SURFACE PROTECTION FILM FOR LIQUID CRYSTAL POLARIZING MEMBRANE, LAMINATE PROVIDED WITH LIQUID CRYSTAL POLARIZING MEMBRANE, AND IMAGE DISPLAY APPARATUS INCLUDING LIQUID CRYSTAL POLARIZING MEMBRANE

(71) Applicant: Mitsubishi Chemical Corporation, Tokyo (JP)

(72) Inventors: Hiroyuki Taniyama, Nagahama (JP); Kohei Hirose, Nagahama (JP); Terutsune Osawa, Ichikawa (JP); Kiyonori Kuroda, Nagahama (JP); Koichi Nishihara, Maibara (JP)

(73) Assignee: Mitsubishi Chemical Corporation, Tokyo (JP)

(*) Notice: Subject to any disclaimer, the term of this patent is extended or adjusted under 35 U.S.C. 154(b) by 293 days.

(21) Appl. No.: 18/323,085

(22) Filed: May 24, 2023

(65) Prior Publication Data

US 2023/0314664 A1 Oct. 5, 2023

Related U.S. Application Data

(63) Continuation of application No. PCT/JP2021/038316, filed on Oct. 15, 2021.

(30) Foreign Application Priority Data

Nov. 27, 2020 (JP) ................................ 2020-197233

(51) Int. Cl.
*G02B 1/14* (2015.01)
*G02B 5/30* (2006.01)
*H10K 59/80* (2023.01)

(52) U.S. Cl.
CPC ............ *G02B 1/14* (2015.01); *G02B 5/3016* (2013.01); *H10K 59/8791* (2023.02)

(58) Field of Classification Search
CPC .......... G02B 1/14; G02B 5/3016; G02B 5/22; G02B 5/30; G02B 5/003; G02B 5/208;
(Continued)

(56) References Cited

U.S. PATENT DOCUMENTS

2006/0134400 A1 6/2006 Takada et al.
2009/0033833 A1 2/2009 Aminaka
(Continued)

FOREIGN PATENT DOCUMENTS

CN 101460306 A 6/2009
CN 103228446 A 7/2013
(Continued)

OTHER PUBLICATIONS

International Search Report issued Dec. 21, 2021 in PCT/JP2021/038316 filed on Oct. 15, 2021, 3 pages.
(Continued)

*Primary Examiner* — Mariam Qureshi
(74) *Attorney, Agent, or Firm* — Oblon, McClelland, Maier & Neustadt, L.L.P.

(57) ABSTRACT

A laminated film for a liquid crystal polarizing film may include a base film and a cured resin layer formed from a curable resin composition, having an average value of light transmittances at 300 to 430 nm of 35% or less.

23 Claims, 2 Drawing Sheets

(58) Field of Classification Search
CPC ............. G02B 5/3041; H10K 59/8791; H10K 59/8793; B32B 27/18; B32B 7/023; B32B 27/00; B32B 27/26; B32B 7/12; C09D 4/00; C09J 7/38; C09J 133/00; C09J 133/14; G02F 1/1335; G02F 1/133528; G02F 1/1337; G09F 9/00; G09F 9/30; H05B 33/02
See application file for complete search history.

(56) References Cited

U.S. PATENT DOCUMENTS

| | | | | |
|---|---|---|---|---|
| 2016/0355704 | A1* | 12/2016 | Takarada | G02B 5/3033 |
| 2020/0142255 | A1* | 5/2020 | Kitagawa | H05B 33/02 |
| 2020/0338872 | A1* | 10/2020 | Ozawa | B32B 27/42 |
| 2021/0087105 | A1* | 3/2021 | Bellman | C03C 17/009 |

FOREIGN PATENT DOCUMENTS

| | | | |
|---|---|---|---|
| CN | 104448981 | A | 3/2015 |
| CN | 107163867 | A | 9/2017 |
| CN | 108139505 | A | 6/2018 |
| CN | 109312019 | A | 2/2019 |
| JP | 2009-173877 | A | 8/2009 |
| JP | 2012-27190 | A | 2/2012 |
| JP | 2012-168295 | A | 9/2012 |
| JP | 2016-155981 | A | 9/2016 |
| JP | 2019-168692 | A | 10/2019 |
| JP | 2019-21 4722 | A | 12/2019 |
| TW | 200632002 | A | 9/2006 |
| TW | 201710429 | A | 3/2017 |
| TW | 201943818 | A | 11/2019 |
| WO | WO-2019/203008 | A1 | 10/2019 |
| WO | WO2020/005041 | A1 | 1/2020 |

OTHER PUBLICATIONS

Combined Taiwanese Office Action and Search Report issued Mar. 13, 2025 in Talwanese Patent Application No. 110138447 (with unedited computer-generated English translation), 17 pages.

Combined Chinese Office Action and Search Report issued Jul. 3, 2025 in Chinese Patent Application No. 202180078605.0, (with unedited computer-generated English translation), 17 pages.

Chinese Office Action issued Nov. 25, 2025, in Chinese Patent Application No. 202180078605.0 with Machie Translation.

Korean Office Action issued Mar. 19, 2026, in Korean Patent Application No. 10-2023-7017738 with machine translation, citing document 1 therein.

Chinese Rejection Decision and Search Report issued May 28, 2026, with Machine translation, documents 1-5 cited therein.

* cited by examiner

LAMINATION FILM FOR LIQUID CRYSTAL POLARIZING MEMBRANE, SURFACE PROTECTION FILM FOR LIQUID CRYSTAL POLARIZING MEMBRANE, LAMINATE PROVIDED WITH LIQUID CRYSTAL POLARIZING MEMBRANE, AND IMAGE DISPLAY APPARATUS INCLUDING LIQUID CRYSTAL POLARIZING MEMBRANE

CROSS-REFERENCE TO RELATED APPLICATIONS

The present application is a bypass continuation of international application PCT/JP2021/038316, filed on Oct. 15, 2021, and claims the benefit of the filing date of Japanese Appl. No. 2020-197233, filed on 27 Nov. 2020, the content of each of which is incorporated by reference.

TECHNICAL FIELD

The present invention relates to a laminated film for a liquid crystal polarizing film, a surface protection film for a liquid crystal polarizing film, a laminate provided with a liquid crystal polarizing film, and an image display apparatus including a liquid crystal polarizing film.

BACKGROUND ART

In recent years, image display apparatuses, such as a liquid crystal display apparatus and an organic EL device, are being demanded to have a reduced thickness and a reduced weight, and to have further enhanced capabilities.

As one measure for enhancing the capabilities of the image display apparatus, the suppression of light deterioration of various optical components constituting the image display apparatus (which may be hereinafter referred simply to as an "optical component") has been investigated, and one of the known examples thereof is an adhesive sheet containing an ultraviolet ray absorbent, which is used by disposing between a surface protection panel and an image display module.

For example, Patent Document 1 describes an optical adhesive sheet having an acrylic-based adhesive layer, having b* of 0.42 or less and a transmittance of light having a wavelength of 350 nm of 5% or less.

Patent Document 2 describes an ultraviolet ray curing acrylic-based adhesive layer having a transmittance at a wavelength of 380 nm of 40% or less and a transmittance at a wavelength of 400 nm of 30% or more, which is disposed between a cover glass sheet or a cover plastic sheet and a polarizing film in an image display apparatus.

CITATION LIST

Patent Literatures

Patent Document 1: JP 2019-214722 A
Patent Document 2: JP 2016-155981 A

SUMMARY OF INVENTION

Technical Problem

However, the transparent adhesives having a light absorbing function for an image display apparatus as in Patent Documents 1 and 2 are to complement the function of a polarizing plate including two protection films for protecting a polarizer, such as in an ordinary TAC film, i.e., the function of a protection film containing an ultraviolet ray absorbent. Therefore, for further reducing the thickness and the weight of the image display apparatuses, there is a demand of the suppression of light deterioration of optical components without the use of a protection film.

Under the circumstances, an object of the present invention is to provide a laminated film that can suppress the light deterioration of optical components and can address the reduction of the thickness and the weight of the image display apparatuses.

Solution to Problem

The present inventors have found that the use of a laminated film having both an ultraviolet ray absorbing function and a surface protection function as a constitutional component of an image display apparatus achieves the reduction of the thickness and the weight of the image display apparatuses while suppressing the light deterioration of optical components, and have completed the present invention.

Specifically, the present invention provides the following items [1] to [27].

[1] A laminated film for a liquid crystal polarizing film, including a base film and a cured resin layer formed from a curable resin composition, having an average value of light transmittances at 300 to 430 nm of 35% or less.

[2] The laminated film for a liquid crystal polarizing film according to the item [1], wherein the base film contains an ultraviolet ray absorbent.

[3] The laminated film for a liquid crystal polarizing film according to the item [2], wherein the ultraviolet ray absorbent comprises at least one selected from the group consisting of a triazine-based ultraviolet ray absorbent, a benzotriazole-based ultraviolet ray absorbent, and a benzoxazine-based ultraviolet ray absorbent.

[4] The laminated film for a liquid crystal polarizing film according to any one of the items [1] to [3], wherein the curable resin composition contains a (meth)acrylate and a modifier.

[5] The laminated film for a liquid crystal polarizing film according to any one of the items [1] to [4], wherein the surface of the cured resin layer side has a surface hardness of H or more.

[6] The laminated film for a liquid crystal polarizing film according to any one of the items [1] to [5], wherein the laminated film does not crack in a 200,000 times bending test under a condition of R=2 mm.

[7] The laminated film for a liquid crystal polarizing film according to any one of the items [1] to [6], wherein the base film is a polyester film.

[8] The laminated film for a liquid crystal polarizing film according to the item [7], wherein the polyester film has a three-layer structure.

[9] The laminated film for a liquid crystal polarizing film according to the item [8], wherein the intermediate layer of the polyester film comprises the ultraviolet ray absorbent.

[10] The laminated film for a liquid crystal polarizing film according to any one of the items [1] to [9], wherein the cured resin layer has a thickness of 1 μm or more and 10 μm or less.

[11] The laminated film for a liquid crystal polarizing film according to any one of the items [1] to [10], wherein the base film has a thickness of 9 μm or more and 125 μm or less.

[12] The laminated film for a liquid crystal polarizing film according to any one of the items [1] to [11], wherein the laminated film has a thickness ratio (base film)/(cured resin layer) of 6 or more.

[13] The laminated film for a liquid crystal polarizing film according to any one of the items [1] to [12], wherein the laminated film has a b-value of 6.0 or less.

[14] The laminated film for a liquid crystal polarizing film according to any one of the items [1] to [13], wherein the laminated film has a light transmittance at 410 nm of 57% or more.

[15] A surface protection film for a liquid crystal polarizing film, including the laminated film for a liquid crystal polarizing film according to any one of the items [1] to [14], having the cured resin layer provided on one surface of the base film and an adhesive layer provided on the other surface thereof.

[16] The surface protection film for a liquid crystal polarizing film according to the item [15], wherein the adhesive layer contains a (meth)acrylic-based polymer (A).

[17] The surface protection film for a liquid crystal polarizing film according to the item [15] or [16], wherein the adhesive layer contains a curable compound (B) and a radical polymerization initiator (C).

[18] The surface protection film for a liquid crystal polarizing film according to any one of the items [15] to [17], wherein the adhesive layer has a thickness of 10 μm or more and 175 μm or less.

[19] A surface protection film provided with a release film, including the surface protection film for a liquid crystal polarizing film according to any one of the items [15] to [18] and a release film, which are laminated on each other.

[20] A laminate provided with a liquid crystal polarizing film, including the laminated film for a liquid crystal polarizing film according to any one of the items [1] to [14] or the surface protection film for a liquid crystal polarizing film according to any one of the items [15] to [18], and a liquid crystal polarizing film, which are laminated on each other.

[21] The laminate provided with a liquid crystal polarizing film according to the item [20], wherein the liquid crystal polarizing film has an optically anisotropic layer.

[22] The laminate provided with a liquid crystal polarizing film according to the item [20] or [21], wherein the liquid crystal polarizing film has an optically anisotropic layer and an orientation membrane.

[23] The laminate provided with a liquid crystal polarizing film according to the item [21] or [22], wherein the optically anisotropic layer contains a polymerizable liquid crystal compound.

[24] The laminate provided with a liquid crystal polarizing film according to any one of the items [21] to [23], wherein the optically anisotropic layer contains a polymerizable liquid crystal compound and a colorant.

[25] The laminate provided with a liquid crystal polarizing film according to any one of the items [20] to [24], wherein the liquid crystal polarizing film has a thickness (total thickness) of ⅕ or less of a thickness of the base film.

[26] The laminate provided with a liquid crystal polarizing film according to any one of the items [20] to [25], wherein the laminate has a change rate of polarization degree at a wavelength of 595 nm of 4.0% or less after a test with a xenon light resistance tester (device name: Ci4000, available from Atlas Testing Solutions) under an irradiation condition of an illuminance of 0.55 W/$m^2$ (340 nm) for 40 hours.

[27] An image display apparatus including the laminate provided with a liquid crystal polarizing film according to any one of the items [20] to [26].

Advantageous Effects of Invention

The laminated film for a liquid crystal polarizing film according to the present invention has both an ultraviolet ray absorbing function and a surface protection function, and thus can suppress the light deterioration of optical components without protection films containing an ultraviolet ray absorbent holding a polarizer from both sides thereof, such as in the ordinary TAC film, and therefore the laminated film can contribute to the reduction of the thickness and the weight and the enhancement of the light deterioration resistance of an image display apparatus.

DESCRIPTION OF EMBODIMENTS

Figure 1:
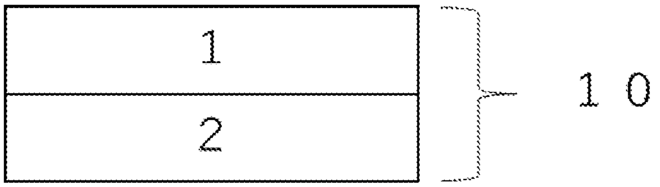
FIG. 1 is a schematic cross-sectional view showing one example of the laminated film for a liquid crystal polarizing film of the present invention.

An example of embodiments of the present invention will be described below. However, the present invention is not limited to the embodiments described below.

<Laminated Film for Liquid Crystal Polarizing Membrane>

[Physical Properties]

The physical properties of the laminated film for a liquid crystal polarizing film according to the present invention (which may be hereinafter referred to as a "present laminated film") will be described.

(Ultraviolet Ray Absorbing Capability)

The present laminated film has an average value of light transmittances at 300 to 430 nm of 35% or less, preferably 33% or less, and more preferably 31% or less.

The present laminated film satisfies the above, and thereby can exert a good ultraviolet ray absorbing capability and can suppress the light deterioration of optical components.

(Surface Hardness)

In the present laminate, the surface of the cured resin layer side preferably has a surface hardness of H or more from the viewpoint of the protection of the surface of the image display apparatus.

The surface hardness in the present invention is a pencil hardness that is obtained according to JIS K5600-5-4:1999 under a load condition of 750 g with a pencil hardness tester (available from Yasuda Seiki Seisakusho, Ltd.).

(Flex Resistance (Flexibility))

The present laminated film preferably does not crack in a 200,000 times bending test under a condition of R=2 mm.

More specifically, it can be determined in such a manner that the present laminated film is subjected to a 200,000 times bending test at R=2 mm with the side of the cured resin layer thereof directed toward the outer surface with a bending tester (DLDMLH-FS, available from Yuasa Co., Ltd.), and the occurrence of cracks on the outer surface of the cured resin layer is visually confirmed.

(Impact Resistance)

In the case where an impact resistance is imparted to the present laminated film, the thickness ratio (base film)/(cured resin layer) is preferably 6 or more. The ratio is more preferably 10 or more, and particularly preferably 15 or more. In the case where the range is satisfied, an impact resistance can be imparted to the base film itself, and furthermore a flex resistance can be imparted thereto although the cured resin layer is a thin film.

(Color (b-Value))

The b-value of the present laminated film is preferably 6.0 or less, more preferably 5.8 or less, further preferably 4.0 or less, and particularly preferably 2.0 or less.

As described later, the liquid crystal polarizing film is constituted by organic compounds having a configuration including a polymerizable liquid crystal compound and a colorant, and therefore there is a concern of color change due to the time deterioration. For suppressing the color change due to the time deterioration, in the case where the present laminated film is adhered to the liquid crystal polarizing film as a cover film of a display through an adhesive layer, it is expected that the color of the display screen viewed from the side of the cover film (i.e., from the side of the present laminated film) is largely changed depending on the color of the laminated film. Accordingly, in the combination of a liquid crystal polarizing film and the present laminated film, the color of the laminated film is preferably close to colorless and transparent from the viewpoint of the suppression of the color change due to the time deterioration and suppressing the color change of the display screen.

(Light Transmittance at 410 nm)

The light transmittance at 410 nm of the present laminated film is preferably 55% or more, more preferably 57% or more, further preferably 65% or more, and particularly preferably 80% or more.

In the case where the base film constituting the laminated film is a polyester film, in particular, the suppression of the light transmittance in the visible region of 410 nm or more may cause a tendency of yellow coloration of the film, and therefore the above range is preferred.

Accordingly, in the present invention, the laminated film is preferably not imparted with a function of cutting light in a wavelength range of 410 nm or more (for example, blue light at 415 to 430 nm). In the present invention, the light having a wavelength of 410 nm is regulated with the liquid crystal polarizing film to be combined with the laminated film, and the wavelength range to be regulated is shared by the laminated film and the liquid crystal polarizing film, and thereby the light transmittance of from the ultraviolet region to the visible region can be regulated.

[Configuration]

The configuration of the present laminated film will be described. As shown in FIG. 1, the present laminated film 10 includes a base film 2 and a cured resin layer 1. The components will be described in detail below.

1. Base Film

The base film constituting the present laminated film is not particularly limited in material, as far as the material can be in a film form. The material of the base film may be, for example, paper, a resin, a metal, or the like. Among these, a resin base film is preferred from the viewpoint of the mechanical strength and the flexibility.

Examples of the resin base film include resin films obtained by forming a polymer into a membrane form, for example, a polyolefin resin, such as polyethylene and polypropylene; a cyclic polyolefin resin, such as a cycloolefin polymer (COP); a polyester resin; a polystyrene resin; a (meth)acrylic resin; a polycarbonate resin; a polyurethane resin; a triacetyl cellulose (TAC) resin; a polyvinyl chloride resin; a polyether resin, such as polyether ketone and polyether sulfone; a polyamide resin; a polyimide resin; and a polyamideimide resin.

A mixture of the materials exemplified above (i.e., a polymer blend) and a material containing complex structural units (i.e., a copolymer) may also be used, as far as the material can be in a film form.

Among the films exemplified above, a polyester film containing a polyester as a major component resin is preferred from the viewpoint of the heat resistance, the flatness, the optical characteristics, the strength, and the like. The "major component resin" means a resin constituting the film that has the largest content ratio, and for example, is a resin that occupies 50% by mass or more, particularly 70% by mass or more, and more particularly 80% by mass or more (encompassing 100% by mass). The polyester film may be a single layer film or a multilayer film including two or more layers having different properties (i.e., a laminated film).

The polyester film may be an unstretched film (sheet) or a stretched film. In particular, a stretched film stretched in a uniaxial direction or in biaxial directions is preferred. In more particular, a biaxially stretched film is preferred from the viewpoint of the balance of mechanical characteristics and the flatness. Accordingly, a biaxially stretched polyester film is more preferred.

In the case where the polyester is a homopolyester, the homopolyester is preferably obtained through polycondensation of an aromatic dicarboxylic acid and an aliphatic glycol. Examples of the aromatic dicarboxylic acid include isophthalic acid, phthalic acid, terephthalic acid, and 2,6-naphthalenedicarboxylic acid, and terephthalic acid is preferred. Examples of the aliphatic glycol include ethylene glycol, diethylene glycol, propylene glycol, 1,4-butanediol, 1,4-cyclohexanedimethanol, and neopentyl glycol, and ethylene glycol is preferred.

Representative examples of the homopolyester include polyethylene terephthalate (PET) and polybutylene terephthalate (PBT).

In the case where the polyester is a copolymer polyester, the polyester contains a third component as a copolymerization component, in addition to the compound as the major component of the dicarboxylic acid component and the compound as the major component of the diol component constituting the polyester. For example, the third component in PET is a component other than terephthalic acid and ethylene glycol.

Specific examples of the dicarboxylic acid and the diol as the major components have been described above. Specific examples of the dicarboxylic acid as the third component include the aforementioned aromatic dicarboxylic acids and also include an aliphatic dicarboxylic acid, such as adipic acid and sebacic acid. Specific examples of the diol as the third component include the aforementioned aliphatic glycols.

The copolymer polyester preferably contains terephthalic acid as the dicarboxylic acid, ethylene glycol as the glycol component, and a dicarboxylic acid or a glycol other than terephthalic acid and ethylene glycol as the third component.

In the copolymer polyester above, the copolymer component is preferably 30% by mol or less in 100% by mol of the total dicarboxylic acid component, and the copolymer component is preferably 30% by mol or less in 100% by mol of the total diol components.

The base film may contain particles mixed therein for the major purpose of imparting slipperiness and preventing scratches from occurring in the process steps. The kind of the particles is not particularly limited, as far as the particles can impart slipperiness, and examples thereof include inorganic particles, such as silica, calcium carbonate, magnesium carbonate, barium carbonate, calcium sulfate, calcium phosphate, magnesium phosphate, kaolin, aluminum oxide, and titanium oxide, and organic particles, such as an acrylic resin, a styrene resin, a urea resin, a phenol resin, an epoxy resin, and a benzoguanamine resin. Furthermore, in the case of the polyester film, deposited particles obtained through precipitation and fine dispersion of a part of the metal compound, such as the catalyst, in the production process of the polyester may also be used.

The shape of the particles used is also not particularly limited, and any of a spherical shape, a bulk shape, a bar shape, a tabular shape, and the like may be used. The hardness, the specific gravity, the color, and the like thereof are also not particularly limited. Two or more of these particles may be used in combination.

The average particle diameter of the particles used is preferably 5 μm or less, and more preferably in a range of 0.1 to 3 μm. In the case where the average particle diameter is in the range, an appropriate surface roughness can be imparted to the film, and thereby good slipperiness and smoothness can be secured. The average particle diameter of the particles herein can be obtained in such a manner that 10 or more particles are measured for the diameter with a scanning electron microscope (SEM), and the average value thereof is designated as the average particle diameter. In this case, for non-spherical particles, the average value of the longest diameter and the shortest diameter may be used as the diameter of the particle for the measurement.

In the case where the particles are mixed, for example, it is preferred that the base film has the laminate structure as described later, and the particles are contained in the surface layer. In this case, it is more preferred that the base film has a multilayer structure including the surface layer containing the particles, the base layer, and the surface layer containing the particles, in this order.

The content of the particles in the base film is preferably 5% by mass or less, and more preferably in a range of 0.0003 to 3% by mass, in 100% by mass of the base film containing the particles. In the case where the content of the particles is in the range, the slipperiness can be easily imparted to the base film while securing the transparency of the base film. However, the base film may contain substantially no particles. In the case where the base film has the laminate structure, the content of the particles described above is the content of the particles in 100% by mass of the layer containing the particles.

In the description herein, the expression "contain substantially no particle" means that the particles are not intentionally contained, and specifically means that the content of the particles (i.e., the mass concentration of the particles) is 200 ppm or less, and more preferably 150 ppm or less, with respect to the member or layer (which is the base film herein). The similar expressions hereinbelow have the same meaning.

In the case where the base film contains substantially no particle, or in the case where the content of the particles is small, the base film has high transparency to provide a film having a good appearance, and the smoothness on the surface of the cured resin layer can be easily enhanced. On the other hand, the slipperiness of the laminated film may be insufficient in some cases. In these cases, for example, the particles may be mixed in the cured resin layer to enhance the slipperiness, or a slippery layer or the like described later containing the particles may be provided to enhance the slipperiness.

[Thickness of Base Film]

The thickness of the base film is preferably 9 to 125 μm, more preferably 12 to 100 μm, and further preferably 20 to 75 μm. In the case where the thickness of the base film is in the range, both the reduction of the thickness of the image display apparatus and the surface protection function can be simultaneously achieved.

[Structure of Base Film]

The base film may be formed of a single layer or may have a laminate structure including two or more layers.

Examples of the laminate structure of the base film include a three-kind and three-layer structure of B/A/C including a base layer A, a surface layer B, and a surface layer C, and a two-kind and three-layer structure of B/A/B including a base layer A and surface layers B. The major component resins constituting the base layer A, the surface layer B, and the surface layer C each are preferably a polyester as described above. In other words, it is preferred that the base film is a polyester film, and the polyester film has a three-layer structure.

In the three-layer structures of B/A/C and B/A/B, the surface layer B and the surface layer C each may contain the particles described above for securing the handleability.

In the three-layer structures of B/A/C and B/A/B, the surface layer B and the surface layer C each may contain, as the particles described above, particles having a substantially uniform average particle diameter with a narrow particle size distribution (i.e., so-called monodisperse particles).

The average particle diameter of the particles in the surface layer B is preferably 0.1 to 5 μm, and more preferably 0.1 to 3 μm. The average particle diameter of the particles in the surface layer C is preferably 0.05 to 5 μm, and more preferably 0.05 to 3 μm.

The average particle diameter of the particles herein can be obtained in such a manner that 10 or more particles are measured for the diameter with a scanning electron microscope (SEM), and the average value thereof is designated as the average particle diameter. In this case, for non-spherical particles, the average value of the longest diameter and the shortest diameter may be used as the diameter of the particle for the measurement.

The contents of the particles in the surface layer B and the surface layer C each are preferably 200 ppm or more, more preferably 300 to 10,000 ppm, further preferably 350 to 9,500 ppm, and still further preferably 400 to 9,000 ppm.

In particular, the content of the particles in the surface layer B is preferably less than 5,000 ppm, and more preferably 300 to 4,000 ppm.

The content of the particles in the surface layer C is particularly preferably 200 ppm or more and 6,000 ppm or less from the viewpoint of the handleability of the film.

The base layer A is preferably allowed to function as a major layer having the largest thickness, and preferably contains substantially no particle or at least contains the particles in a lower concentration than the surface layer B for reducing the cost.

[Ultraviolet Ray Absorbent]

The base film preferably contains an ultraviolet ray absorbent. The ultraviolet ray absorbent contained can suppress the light deterioration of optical components.

In the case where the base film is a polyester film having a laminate structure, at least one layer thereof preferably contains the ultraviolet ray absorbent. The ultraviolet ray absorbent is preferably contained in the intermediate layer (i.e., the layer A in the B/A/C structure or the B/A/B structure described above) from the viewpoint of the prevention of bleed-out of the ultraviolet ray absorbent.

Examples of the ultraviolet ray absorbent include a benzophenone-based ultraviolet ray absorbent, a benzotriazole-based ultraviolet ray absorbent, a triazine-based ultraviolet ray absorbent, a salicylic acid-based ultraviolet ray absorbent, a cyanoacrylate-based ultraviolet ray absorbent, and a benzoxazine-based ultraviolet ray absorbent. One of the ultraviolet ray absorbents may be used alone, or two or more thereof may be used in combination.

Examples of the benzophenone-based ultraviolet ray absorbent include 2,4-dihydroxybenzophenone, 2-hydroxy-4-methoxybenzophenone, 2-hydroxy-4-octoxybenzophenone, 2-hydroxy-4-benzylbenzophenone, 2-hydroxy-4-methoxybenzophenone-5-sulfonic acid, 2-hydroxy-4-methoxybenzophenone-5-sulfonic acid trihydrate, 2,2'-dihydroxy-4-methoxybenzophenone, 2,2',4,4'-tetrahydroxybenzophenone, 2,2'-dihydroxy-4,4'-dimethoxybenzophenone, sodium 2,2'-dihydroxy-4,4'-dimethoxybenzophenone-5-sulfonate, bis(5-benzoyl-4-hydroxy-2-methoxyphenyl)methane, 2-hydroxy-4-n-dodecyloxybenzophenone, and 2-hydroxy-4-methoxy-2'-carboxybenzophenone.

Examples of the benzotriazole-based ultraviolet ray absorbent include 2-(2-hydroxy-5-methylphenol)benzotriazole, 2-(2-hydroxy-5-tert-octylphenyl)benzotriazole, 2-(2-hydroxy-3,5-dicumylphenyl)benzotriazole, 2-(2-hydroxy-3-tert-butyl-5-methylphenyl)-5-chlorobenzotriazole, 2,2'-methylenebis[4-(1,1,3,3-tetramethylbutyl)-6-(2H-benzotriazol-2-yl)phenol], 2-(2-hydroxy-3,5-di-tert-butylphenyl)benzotriazole, 2-(2-hydroxy-3,5-di-tert-butylphenyl)-5-chlorobenzotriazole, 2-(2-hydroxy-3,5-di-tert-amylphenyl)benzotriazole, 2-(2-hydroxy-5-tert-butylphenyl)benzotriazole, 2-(2-hydroxy-4-octoxyphenyl) benzotriazole, 2,2'-methylenebis(4-cumyl-6-(2H-benzotriazol-2-yl)phenol, 2,2'-methylenebis[6-(2H-benzotriazol-2-yl)-4-(2-hydroxyethyl)phenol], and 2-[2-hydroxy-3-(4,5,6,7-tetrahydro-1,3-dioxo-1H-isoindol-2-ylmethyl)-5-methylphenyl]-2H-benzotriazole.

Examples of the triazine-based ultraviolet ray absorbent include 2-(2-hydroxy-4-methoxyphenyl)-4,6-diphenyl-1,3,5-triazine, 2-(2-hydroxy-4-ethoxyphenyl)-4,6-diphenyl-1,3,5-triazine, 2-(2-hydroxy-4-propoxyphenyl)-4,6-diphenyl-1,3,5-triazine, 2-(2-hydroxy-4-butoxyphenyl)-4,6-diphenyl-1,3,5-triazine, 2-(2-hydroxy-4-hexyloxyphenyl)-4,6-diphenyl-1,3,5-triazine, 2-(2-hydroxy-4-octyloxyphenyl)-4,6-diphenyl-1,3,5-triazine, 2-(2-hydroxy-4-dodecyloxyphenyl)-4,6-diphenyl-1,3,5-triazine, 2-(2-hydroxy-4-benzyloxyphenyl)-4,6-diphenyl-1,3,5-triazine, 2,4-bis(2-hydroxy-4-butoxyphenyl)-6-(2,4-dibutoxyphenyl)-1,3,5-triazine, 2,4,6-tris(2-hydroxy-4-hexyloxy-3-methylphenyl)-1,3,5-triazine, 2-(2-hydroxy-4-[1-octyloxycarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, 2-[4-[(2-hydroxy-3-(2'-ethyl)hexyl)oxy]-2-hydroxyphenyl]-4,6-bis(2,4-dimethylphenyl)-1,3,5-triazine, 2-(2-hydroxy-4-acryloyloxyethoxyphenyl)-4,6-bis(2,4-dimethylphenyl)-1,3,5-triazine, 2,4-diphenyl-6-(2-hydroxynaphthyl)-1,3,5-triazine, and 2,4,6-tris(2-hydroxynaphthyl)-1,3,5-triazine.

Examples of the salicylic acid-based ultraviolet ray absorbent include phenyl salicylate, p-tert-butylphenyl salicylate, and p-octylphenyl salicylate.

Examples of the cyanoacrylate-based ultraviolet ray absorbent include 2-ethylhexyl 2-cyano-3,3'-diphenylacrylate and ethyl 2-cyano-3,3'-diphenylacrylate.

Examples of the benzoxazine-based ultraviolet ray absorbent include 2,2'-(1,4-phenylene)bis(4H-3,1-benzoxazin-4-one), 2-methyl-3,1-benzoxazin-4-one, 2-butyl-3,1-benzoxazin-4-one, and 2-phenyl-3,1-benzoxazin-4-one.

Among these, one or more selected from the group consisting of the benzophenone-based ultraviolet ray absorbent, the benzotriazole-based ultraviolet ray absorbent, the triazine-based ultraviolet ray absorbent, and the benzoxazine-based ultraviolet ray absorbent is preferred, and one or more selected from the group consisting of the triazine-based ultraviolet ray absorbent, the benzotriazole-based ultraviolet ray absorbent, and the benzoxazine-based ultraviolet ray absorbent is more preferred, from the viewpoint of the effective suppression of the light deterioration of optical components.

The lower limit value of the content of the ultraviolet ray absorbent is preferably 0.1% by mass or more, more preferably 0.5% by mass or more, further preferably 1.5% by mass or more, still further preferably 3% by mass or more, and particularly preferably 5% by mass or more, in 100% by mass of the base film containing the ultraviolet ray absorbent, from the viewpoint of the enhancement of the light resistance reliability. In the case where the base film has the laminate structure, the content of the ultraviolet ray absorbent described above is the amount of the ultraviolet ray absorbent in 100% by mass of the layer containing the ultraviolet ray absorbent.

The upper limit value of the content of the ultraviolet ray absorbent is preferably 15% by mass or less, more preferably 12% by mass or less, further preferably 10% by mass or less, still further preferably 8% by mass or less, and particularly preferably 7% by mass or less, from the viewpoint of the suppression of the bleed-out and the enhancement of the yellowing resistance.

In the case where two or more of the ultraviolet ray absorbents are used in combination, the total amount thereof satisfies the above range.

2. Cured Resin Layer

The cured resin layer constituting the present laminated film is formed by curing a curable resin composition. The cured resin layer may also have, for example, a function of protecting optical components.

The cured resin layer may be formed only on one surface of the base film, and may be formed on both the surfaces thereof.

The curable resin composition may contain, as a component becoming a polymer through polymerization, a photopolymerizable compound and/or a thermally polymerizable compound, and in the present invention, a photocurable resin composition containing a photopolymerizable compound is preferred. The photopolymerizability avoids the necessity of a heat treatment at a high temperature for curing the curable resin composition, and therefore the formation of impurities in the heat treatment, the occurrence of thermal shrinkage, and the like can be prevented. Examples of the polymerizable compound include a monomer having one or two or more of a polymerizable functional group in one molecule.

[Curable Resin Composition (α)]

The curable resin composition of the present invention is preferably a curable resin composition (α) containing a (meth)acrylate (HA) and a modifier (HB). In the curable resin composition (α), typically, the component (HA) is a photopolymerizable compound, or both the component (HA) and the component (HB) are photopolymerizable compounds.

In the present invention, the case using the expression "(meth)acrylate" means one or both of an "acrylate" and a "methacrylate", the case using the expression "(meth)acryloyl" means one or both of "acryloyl" and "methacryloyl", the case using the expression "(meth)acrylic" means one or both of "acrylic" and "methacrylic", and the same is applied to the similar expressions.

The (meth)acryloyl group concentration of the compound having a (meth)acryloyl group used in the present invention may be shown in terms of (meth)acryloyl group equivalent (g/eq). The (meth)acryloyl group equivalent means the average molecular weight per one (meth)acryloyl group. For example, in the case where a (meth)acrylate-based compound having a number average molecular weight (Mn) of 10,000 has a number of a (meth)acryloyl group of 10 per one molecule, the (meth)acryloyl group equivalent thereof is 10,000/10=1,000 g/eq.

The number average molecular weight (Mn) is a value that is measured by gel permeation chromatography (GPC) and calculated as the standard polystyrene conversion.

((Meth)Acrylate (HA))

The curable resin composition (α) contains a (meth) acrylate (HA), and thereby the flex resistance enhancing effect for the cured resin layer is easily improved. Furthermore, the scratch resistance, the adhesiveness to the base film, and the like thereof can also be easily enhanced.

Examples of the (meth)acrylate (HA) include a trifunctional or higher polyfunctional (meth)acrylate having 3 or more ethylenic unsaturated groups, such as trimethylolpropane tri(meth)acrylate, ethoxylated trimethylolpropane tri (meth)acrylate, propoxylated trimethylolpropane tri(meth) acrylate, tris-2-hydroxyethyl isocyanurate tri(meth)acrylate, glycerin tri(meth)acrylate, pentaerythritol tri(meth)acrylate, dipentaerythritol tri(meth)acrylate, ditrimethylolpropane tri (meth)acrylate, pentaerythritol tetra(meth)acrylate, ditrimethylolpropane tetra(meth)acrylate, dipentaerythritol penta (meth)acrylate, ditrimethylolpropane penta(meth)acrylate, dipentaerythritol hexa(meth)acrylate, and ditrimethylolpropane hexa(meth)acrylate; a modified compound of a polyfunctional (meth)acrylate compound obtained by substituting a part of the (meth)acrylate with an alkyl group or ε-caprolactone; a polyfunctional (meth)acrylate having a nitrogen atom-containing heterocyclic structure, such as a polyfunctional (meth)acrylate having an isocyanurate structure; a polyfunctional (meth)acrylate having a multiple branched structure, such as a polyfunctional (meth)acrylate having a dendrimer structure and a polyfunctional (meth) acrylate having a hyper branched structure; a urethane (meth)acrylate obtained by adding a (meth)acrylate having a hydroxy group, such as pentaerythritol tri(meth)acrylate, dipentaerythritol tri(meth)acrylate, and dipentaerythritol penta(meth)acrylate, to a polyisocyanate, such as a diisocyanate and a triisocyanate, or a trimer isocyanate thereof; and a polyfunctional urethane (meth)acrylate formed of a reaction product of a polyol compound having two or more hydroxy groups in molecule, a compound having two or more isocyanate groups in molecule, and a (meth)acrylate having at least one or more hydroxy group in molecule. The (meth)acrylate having a hydroxy group is preferably polyfunctional with two or more ethylenic unsaturated groups. The (meth)acrylate (HA) preferably contains a urethane (meth)acrylate.

Among the above, pentaerythritol tri(meth)acrylate, pentaerythritol tetra(meth)acrylate, dipentaerythritol hexa(meth)acrylate, dipentaerythritol penta(meth)acrylate, a urethane (meth)acrylate as a reaction product of pentaerythritol tri(meth)acrylate and hexamethylene diisocyanate, a urethane (meth)acrylate as a reaction product of pentaerythritol tri(meth)acrylate and isophorone diisocyanate, a urethane (meth)acrylate as a reaction product of pentaerythritol penta (meth)acrylate and hexamethylene diisocyanate, a urethane (meth)acrylate as a reaction product of pentaerythritol penta (meth)acrylate and isophorone diisocyanate, and a polyfunctional (meth)acrylate formed of a reaction product of a polyol compound having two or more hydroxy groups in molecule, a compound having two or more isocyanate groups in molecule, and a (meth)acrylate having at least one or more hydroxy group in molecule are preferred, from the viewpoint of the scratch resistance and the weather resistance of the coating film, and the suppression of the bleed-out of the ultraviolet ray absorbent. Only one of these compounds may be used alone, or two or more thereof may be used in combination.

Among the above, furthermore, a trifunctional to hexafunctional polyfunctional (meth)acrylate and a urethane (meth)acrylate obtained by adding a polyfunctional (for example, trifunctional to pentafunctional) (meth)acrylate having a hydroxy group to a polyisocyanate are more preferred, and it is also preferred to use the polyfunctional (meth)acrylate and the urethane (meth)acrylate described above in combination. The polyisocyanate used in the urethane (meth)acrylate is further preferably a diisocyanate.

The mass average molecular weight of the (meth)acrylate (HA) is, for example, 250 or more and 8,000 or less, preferably 300 or more and 7,000 or less, more preferably 400 or more and 5,000 or less, and particularly preferably 500 or more and 4,000 or less. In the case where the range is satisfied, the bleed-out suppressing effect of the ultraviolet ray absorbent can be improved.

The mass average molecular weight is a value that is measured by gel permeation chromatography (GPC) and calculated as the standard polystyrene conversion.

The (meth)acryloyl group equivalent of the (meth)acrylate (HA) is, for example, 80 g/eq or more and less than 150 g/eq, preferably 85 g/eq or more and less than 135 g/eq, and more preferably 90 g/eq or more and less than 120 g/eq. In the case where the (meth)acryloyl group equivalent of the (meth)acrylate (A) is in the range, the flex resistance can be imparted.

The urethane (meth)acrylate as the component (HA) is the reaction product of the polyisocyanate or the isocyanurate and the (meth)acrylate having a hydroxy group as described above, and may be formed through reaction of a mixture of the polyisocyanate or the isocyanurate, the (meth)acrylate having a hydroxy group, and a (meth)acrylate having no hydroxy group. In this case, the (meth)acrylate having no hydroxy group remains unreacted, and may be allowed to exist in the curable resin composition (α) and to function as the component (HA).

(Modifier (HB))

The curable resin composition (α) contains the (meth) acrylate component (HA) and the modifier (HB) in combination, and thereby providing such an advantage that the occurrence of curl, thermal wrinkles, and the like is prevented to improve the flatness of the film, while retaining and enhancing the flex resistance. The modifier (HB) is not particularly limited, as far as the gist of the present invention is not impaired, and is preferably at least one selected from a (meth)acrylic-based polymer and a urethane (meth)acrylate.

The modifier (HB) preferably has a molecular weight that is larger than the (meth)acrylate (HA). The modifier (HB) can provide a modification effect of improving the flatness of the film by having a larger molecular weight than the (meth)acrylate (HA).

The urethane (meth)acrylate used as the modifier (HB) may be used, for example, as a component that modifies the curable resin composition (α) containing the component (HA) containing a (meth)acrylate, and may be a component having a molecular weight that is larger than the (meth) acrylate used as the component (HA).

Accordingly, in the case where a urethane (meth)acrylate is used as the component (HB), the curable resin composition (α) may contain a urethane (meth)acrylate as the component (HA) and a urethane (meth)acrylate as the component (HB) having a molecular weight that is larger than the urethane (meth)acrylate as the component (HA).

=(Meth)Acrylic-Based Polymer=

The mass average molecular weight of the (meth)acrylic-based polymer used as the component (HB) is larger than the (meth)acrylate (A), and is preferably 1,000 or more and 100,000 or less, more preferably 3,000 or more and 70,000 or less, further preferably 5,000 or more and 30,000 or less, and still further preferably 10,000 or more and 30,000 or less.

In the case where the mass average molecular weight of the (meth)acrylic-based polymer is 1,000 or more and 100,000 or less, the flatness of the film can be easily secured. In the case where the mass average molecular weight of the (meth)acrylic-based polymer is 1,000 or more, the surface hardness of the cured resin layer can be prevented from being decreased. In the case where the mass average molecular weight of the (meth)acrylic-based polymer is 70,000 or less, the viscosity of the coating liquid can be prevented from being increased, and the smoothness of the cured resin layer can be prevented from being deteriorated.

The (meth)acrylic-based polymer is a polymer having an alkyl (meth)acrylate ester as a major constitutional unit. Examples of the alkyl (meth)acrylate ester include a chain-like alkyl (meth)acrylate ester, such as methyl (meth)acrylate, ethyl (meth)acrylate, n-propyl (meth)acrylate, isopropyl (meth)acrylate, n-butyl (meth)acrylate, isobutyl (meth) acrylate, sec-butyl (meth)acrylate, t-butyl (meth)acrylate, n-pentyl (meth)acrylate, and n-hexyl (meth)acrylate, and an alkyl (meth)acrylate ester having a cyclic structure, such as isobornyl (meth)acrylate, 4-t-butylcyclohexyl (meth)acrylate, tricyclodecanyl (meth)acrylate, dicyclopentaenyl (meth)acrylate, and adamantyl (meth)acrylate. One of these compounds may be used alone, or two or more thereof may be used in combination. Among these, methyl (meth)acrylate is preferred from the viewpoint of the compatibility of the (meth)acrylic-based polymer with the (meth)acrylate, and the heat resistance of the cured resin layer. Accordingly, a polymer having methyl (meth)acrylate as a major constitutional unit is preferred. The (meth)acrylic-based polymer may have a double bond capable of undergoing radical polymerization.

The major constitutional unit means that in the (meth) acrylic-based polymer, the constitutional unit is a major component, which is contained in an amount of, for example, 50% by mass or more, preferably 70% by mass or more, and more preferably 85% by mass or more.

The (meth)acrylic-based polymer may be copolymerized with a (meth)acrylate ester other than the alkyl (meth) acrylate ester, (meth)acrylic acid, and a compound having a vinyl group, for the purpose of improving the glass transition temperature, the mechanical properties, the compatibility, and the like. Examples of the (meth)acrylate ester other than the alkyl (meth)acrylate ester include a hydroxyalkyl (meth) acrylate, such as hydroxyethyl (meth)acrylate, hydroxypropyl (meth)acrylate, and hydroxybutyl (meth)acrylate, an alkoxyalkyl (meth)acrylate ester, such as methoxymethyl (meth)acrylate, methoxyethyl (meth)acrylate, ethoxymethyl (meth)acrylate, and ethoxyethyl (meth)acrylate, phenyl (meth)acrylate, benzyl (meth)acrylate, glycidyl (meth)acrylate, and γ-butyrolactone (meth)acrylate.

Examples of the compound having a vinyl group include an acrylamide-based compound, such as dimethylacrylamide, hydroxyethylacrylamide, and dimethylaminopropylacrylamide, a styrene-based compound, such as styrene, α-methylstyrene, and p-methoxystyrene, and maleic anhydride.

The glass transition temperature (Tg) of the (meth) acrylic-based polymer is preferably 60° C. or more, more preferably 80° C. or more, and further preferably 90° C. or more, from the viewpoint of the improvement of the mechanical characteristics of the cured resin layer. The glass transition temperature (Tg) thereof is preferably 140° C. or less, more preferably 130° C. or less, and further preferably 120° C. or less, from the viewpoint of the improvement of the processability of the laminated film having the cured resin layer laminated thereon.

The glass transition temperature (Tg) can be obtained from the kind of the monomer constituting the (meth) acrylic-based polymer and the mass fraction thereof according to the Fox's expression below.

$$1/Tg=\Sigma(Wi/Tgi)$$

In the expression, Tg represents the glass transition temperature (unit: K) of the (meth)acrylic-based polymer, Wi represents the mass fraction of the monomer unit derived from the monomer i constituting the (meth)acrylic-based polymer, and Tgi represents the glass transition temperature (unit: K) of the homopolymer of the monomer i. The value of Tgi used may be the value described in Polymer Handbook, Volume 1 (Wiley-Interscience).

=Urethane (Meth)Acrylate=

The urethane (meth)acrylate used as the modifier (HB) is a compound obtained through reaction of an isocyanate-based compound and a hydroxy group-containing (meth) acrylate-based compound, or a compound obtained through reaction of an isocyanate-based compound, a polyol-based compound, and a hydroxy group-containing (meth)acrylate-based compound. The urethane (meth)acrylate may be used alone, or two or more thereof may be used in combination. The use of the urethane (meth)acrylate as the modifier (HB) can improve the scratch resistance.

Examples of the isocyanate-based compound include a polyisocyanate-based compound, such as an aromatic-based polyisocyanate, an aliphatic-based polyisocyanate, and an alicyclic-based polyisocyanate, and among these, a diisocyanate compound is preferred. Examples of the isocyanate-based compound also include an isocyanate-based compound having an isocyanurate skeleton obtained by isocyanurating a diisocyanate compound.

Examples of the aromatic-based polyisocyanate include tolylene diisocyanate, diphenylmethane diisocyanate, polyphenylmethane diisocyanate, modified diphenylmethane diisocyanate, xylylene diisocyanate, tetramethylxylylene diisocyanate, phenylene diisocyanate, and naphthalene diisocyanate.

Examples of the aliphatic-based polyisocyanate include hexamethylene diisocyanate, pentamethylene diisocyanate, trimethylhexamethylene diisocyanate, lysine diisocyanate, and lysine triisocyanate.

Examples of the alicyclic-based polyisocyanate include hydrogenated diphenylmethane diisocyanate, hydrogenated xylylene diisocyanate, isophorone diisocyanate, norbornene diisocyanate, 1,3-bis(isocyanatomethyl)cyclohexane, and 1,4-bis(isocyanatomethyl)cyclohexane.

Among these, an aliphatic-based diisocyanate and an alicyclic-based diisocyanate are preferred from the viewpoint of the excellent yellowing resistance. An isocyanate-based compound having an isocyanurate skeleton is also preferred, and an isocyanate-based compound having an isocyanurate skeleton obtained by isocyanurating an aliphatic-based diisocyanate or an alicyclic-based diisocyanate is also preferred from the same standpoint, among which an isocyanate-based compound having an isocyanurate skeleton is more preferred.

One of the isocyanate-based compounds may be used alone, or two or more thereof may be used in combination.

Examples of the hydroxy group-containing (meth)acrylate include a monofunctional hydroxy group-containing (meth)acrylate having one ethylenic unsaturated bond, such as a hydroxyalkyl (meth)acrylate, such as 2-hydroxyethyl (meth)acrylate, 2-hydroxypropyl (meth)acrylate, 2-hydroxybutyl (meth)acrylate, 4-hydroxybutyl (meth)acrylate, and 6-hdyroxyhexyl (meth)acrylate, 2-hydroxyethylacryloyl phosphate, 2-(meth)acryloyloxyethyl-2-hydroxypropyl phthalate, caprolactone-modified 2-hydroxyethyl (meth) acrylate, dipropylene glycol (meth)acrylate, a fatty acid-modified glycidyl (meth)acrylate, polyethylene glycol mono (meth)acrylate, polypropylene glycol mono(meth)acrylate, and 2-hydroxy-3-(meth)acryloyloxypropyl (meth)acrylate; a bifunctional hydroxy group-containing (meth)acrylate having two ethylenic unsaturated bonds, such as glycerin di(meth)acrylate and 2-hydroxy-3-acryloyolxypropyl methacrylate; and trifunctional or higher functional hydroxy group-containing (meth)acrylate having three or more ethylenic unsaturated bonds, such as pentaerythritol tri(meth)acrylate, pentaerythritol tetra(meth)acrylate, caprolactone-modified pentaerythritol tri(meth)acrylate, ethylene oxide-modified pentaerythritol tri(meth)acrylate, dipentaerythritol penta(meth)acrylate, caprolactone-modified dipentaerythritol penta (meth)acrylate, and ethylene oxide-modified dipentaerythritol penta(meth)acrylate. One of these compounds may be used, or two or more of these compounds may be used in combination.

Among these, a (meth)acrylate-based compound having three or less ethylenic unsaturated bond is preferred, in which a (meth)acrylate-based compound having two or more ethylenic unsaturated bond is more preferred, and pentaerythritol tri(meth)acrylate and/or pentaerythritol tetra (meth)acrylate are particularly preferred, from the viewpoint of the excellent reactivity and versatility, and the excellent balance between the scratch resistance of the cured coating film and the flatness of the film.

It suffices that the polyol-based compound is a compound having two or more hydroxy groups (provided that the aforementioned hydroxy group-containing (meth)acrylate is excluded).

Examples of the polyol-based compound include an aliphatic polyol, an alicyclic polyol, a polyether-based polyol, a polyester-based polyol, a polycarbonate-based polyol, a polyolefin-based polyol, a polybutadiene-based polyol, a polyisoprene-based polyol, a (meth)acrylic-based polyol, and a polysiloxane-based polyol.

Examples of the aliphatic polyol include an aliphatic alcohol compound having two hydroxy groups, such as ethylene glycol, diethylene glycol, propylene glycol, dipropylene glycol, trimethylene glycol, dimethylolpropane, neopentyl glycol, 2,2-diethyl-1,3-propanediol, 2-butyl-2-ethyl-1,3-propanediol, 1,4-tetramethylenediol, 1,3-tetramethylenediol, 2-methyl-1,3-trimethylenediol, 1,5-pentamethylenediol, 1,6-hexamethylenediol, 3-methyl-1,5-pentamethylenediol, 2,4-diethyl-1,5-pentamethylenediol, pentaerythritol diacrylate, 1,9-nonanediol, and 2-methyl-1,8-octanediol, a sugar alcohol compound, such as xylitol and sorbitol, and an aliphatic alcohol compound having three or more hydroxy groups, such as glycerin, trimethylolpropane, and trimethylolethane.

Examples of the alicyclic polyol include a cyclohexanediol compound, such as 1,4-cyclohexanediol and cyclohexanedimethanol, a hydrogenated bisphenol compound, such as hydrogenated bisphenol A, and tricyclodecanedimethanol.

Examples of the polyether-based polyol include a polyether-based polyol containing an alkylene structure, such as polyethylene glycol, polypropylene glycol, polytetramethylene glycol, polybutylene glycol, polypentamethylene glycol, and polyhexamethylene glycol, and a random or block copolymer of the polyalkylene glycol.

Examples of the polyester-based polyol include a polycondensation product of a polyhydric alcohol and a polycarboxylic acid, a ring-opening polymerization product of a cyclic ester (lactone), and a reaction product of three components including a polyhydric alcohol, a polycarboxylic acid, and a cyclic ester.

Examples of the polyhydric alcohol include ethylene glycol, diethylene glycol, propylene glycol, dipropylene glycol, trimethylene glycol, 1,4-tetramethylenediol, 1,3-tetramethylenediol, 2-methyl-1,3-trimethylenediol, 1,5-pentamethylenediol, neopentyl glycol, 1,6-hexamethylenediol, 3-methyl-1,5-pentamethylenediol, 2,4-diethyl-1,5-pentamethylenediol, glycerin, trimethylolpropane, trimethylolethane, a cyclohexanediol compound (such as 1,4-cyclohexanediol), a bisphenol compound (such as bisphenol A), and a sugar alcohol compound (such as xylitol and sorbitol).

Examples of the polycarboxylic acid include an aliphatic dicarboxylic acid, such as malonic acid, maleic acid, fumaric acid, succinic acid, glutaric acid, adipic acid, suberic acid, azelaic acid, sebacic acid, and a dodecanedioic acid, an alicyclic dicarboxylic acid, such as 1,4-cyclohexanedicarboxylic acid, and an aromatic dicarboxylic acid, such as terephthalic acid, isophthalic acid, orthophthalic acid, 2,6-naphthalenedicarboxylic acid, p-phenylenedicarboxylic acid, and trimellitic acid.

Examples of the cyclic ester include propiolactone, β-methyl-δ-valerolactone, and ε-caprolactone.

Examples of the polycarbonate-based polyol include a reaction product of a polyhydric alcohol and phosgene, and a ring-opening polymerization product of a cyclic carbonate ester (such as an alkylene carbonate).

Examples of the polyhydric alcohol used in the polycarbonate-based polyol include the polyhydric alcohols exemplified in the description for the polyester-based polyol, and examples of the alkylene carbonate include ethylene carbonate, trimethylene carbonate, tetramethylene carbonate, and hexamethylene carbonate.

It suffices that the polycarbonate-based polyol is a compound having a carbonate bond in the molecule and having a hydroxy group at the end thereof, and the polycarbonate-based polyol may have both a carbonate bond and an ester bond.

Examples of the polyolefin-based polyol include a compound having a homopolymer or a copolymer of ethylene, propylene, butene, or the like, as a saturated hydrocarbon skeleton, and having hydroxy groups at the ends of the molecule.

Examples of the polybutadiene-based polyol include a compound having a copolymer of butadiene as a hydrocarbon skeleton, and having hydroxy groups at the ends of the molecule.

The polybutadiene-based polyol may be a hydrogenated polybutadiene polyol having ethylenic unsaturated bonds contained in the structure thereof that are wholly or partially hydrogenated.

Examples of the polyisoprene-based polyol include a compound having a copolymer of isoprene as a hydrocarbon skeleton, and having hydroxy groups at the ends of the molecule.

The polyisoprene-based polyol may be a hydrogenated polyisoprene polyol having ethylenic unsaturated bonds contained in the structure thereof that are wholly or partially hydrogenated.

Examples of the (meth)acrylic-based polyol include a polymer or a copolymer of a (meth)acrylate ester having at least two hydroxy groups in the molecule thereof, and examples of the (meth)acrylate ester include an alkyl (meth) acrylate ester, such as methyl (meth)acrylate, ethyl (meth) acrylate, propyl (meth)acrylate, butyl (meth)acrylate, hexyl (meth)acrylate, octyl (meth)acrylate, 2-ethylhexyl (meth) acrylate, decyl (meth)acrylate, dodecyl (meth)acrylate, and octadecyl (meth)acrylate. A copolymer of a (meth)acrylate ester and a hydroxyalkyl (meth)acrylate, such as hydroxyethyl (meth)acrylate, hydroxypropyl (meth)acrylate, and hydroxybutyl (meth)acrylate, may also be used.

Examples of the polysiloxane-based polyol include dimethylpolysiloxanepolyol and methylphenylpolysiloxanepolyol.

One of the polyol-based compounds may be used, or two or more thereof may be used in combination.

In the addition reaction of the isocyanate-based compound and a hydroxy group-containing (meth)acrylate-based compound, or the addition reaction of the isocyanate-based compound, a hydroxy group-containing (meth) acrylate-based compound, and the polyol, the reaction may be terminated at the time when the content of the residual isocyanate group in the reaction system becomes 0.5% by mass or less, and thereby the urethane (meth)acrylate can be obtained.

In the case where the urethane (meth)acrylate as the modifier (HB) contains the compound obtained through reaction of the isocyanate-based compound, the polyol-based compound, and the hydroxy group-containing (meth) acrylate-based compound, the compound may be obtained through reaction of a reaction product having an isocyanate group obtained through reaction of the isocyanate-based compound and the polyol-based compound, or a mixture of the reaction product and the isocyanate-based compound, with the hydroxy group-containing (meth)acrylate-based compound.

The urethane (meth)acrylate used as the modifier (HB) obtained through the reaction may be a mixture of a compound obtained through reaction of the isocyanate-based compound and the hydroxy group-containing (meth)acrylate-based compound, and a compound obtained through reaction of the isocyanate-based compound, the polyol-based compound, and the hydroxy group-containing (meth) acrylate-based compound.

In the reaction of the isocyanate-based compound and the hydroxy group-containing (meth)acrylate-based compound, a catalyst is preferably used for the purpose of accelerating the reaction, and examples of the catalyst include an organometallic compound, such as dibutyltin dilaurate, dibutyltin diacetate, trimethyltin hydroxide, tetra-n-butyltin, zinc bisacetylacetonate, zirconium tris(acetylacetonate)ethylacetoacetonate, and zirconium tetraacetylacetonate, a metal salt, such as tin octenoate, zinc hexanoate, zinc octenoate, zinc stearate, zirconium 2-ethylhexanoate, cobalt naphthenate, stannous chloride, stannic chloride, and potassium acetate, an amine-based catalyst, such as triethylamine, triethylenediamine, benzyldiethylamine, 1,4-diazabicyclo[2,2,2]octane, 1,8-diazabicyclo[5,4,0]undecene, N,N,N',N'-tetramethyl-1,3-butanediamine, N-methylmorpholine, and N-ethylmorpholine, and a bismuth-based catalyst, such as bismuth nitrate, bismuth bromide, bismuth iodide, and bismuth sulfide, which also includes an organic bismuth compound, such as dibutylbismuth dilaurate and dioctylbismuth dilaurate, and an organic acid bismuth salt, such as bismuth 2-ethylhexanoate, bismuth naphthenate, bismuth isodecanoate, bismuth neodecanoate, bismuth laurate, bismuth maleate, bismuth stearate, bismuth oleate, bismuth linoleate, bismuth acetate, bismuth bisneodecanoate, bismuth disalicylate, and bismuth subgallate, in which dibutyltin dilaurate and 1,8-diazabicyclo[5,4,0]undecene are preferred. These compounds each may be used alone, or two or more thereof may be used in combination.

In the reaction of the isocyanate-based compound and the hydroxy group-containing (meth)acrylate-based compound, an organic solvent having no functional group that has reactivity with an isocyanate group may be used, for example, an ester compound, such as ethyl acetate and butyl acetate, a ketone compound, such as methyl ethyl ketone and methyl isobutyl ketone, and an aromatic compound, such as toluene and xylene. A polymerization inhibitor may also be appropriately used.

The urethane (meth)acrylate as the component (HB) is a reaction product of the hydroxy group-containing (meth) acrylate-based compound and the isocyanate-based compound, or the hydroxy group-containing (meth)acrylate-based compound, the isocyanate-based compound, and the polyol-based compound, and may be formed through reaction of the (meth)acrylate having a hydroxy group, a (meth) acrylate having no hydroxy group, and the isocyanate-based compound. Alternatively, the urethane (meth)acrylate may be formed through reaction of a mixture of the (meth) acrylate having a hydroxy group and a (meth)acrylate having no hydroxy group, the isocyanate-based compound, and the polyol-based compound. In this case, the (meth)acrylate having no hydroxy group remains unreacted, and may be allowed to exist in the curable resin composition and to function as the component (HA).

In the reaction of the isocyanate-based compound and the hydroxy group-containing (meth)acrylate-based compound as described above, a part or the whole of the isocyanate-based compound may be a reaction product of the isocyanate-based compound and the polyol-based compound as described above.

The mass average molecular weight of the urethane (meth)acrylate used as the modifier (HB) is larger than the (meth)acrylate (HA), and is, for example, 3,000 or more and 100,000 or less, preferably 5,000 or more and 70,000 or less, and more preferably 8,000 or more and 30,000 or less. In the case where the range is satisfied, good flatness of the film can be obtained by forming the cured resin layer in the laminate structure of the laminated film and the like.

The (meth)acryloyl group equivalent of the urethane (meth)acrylate used as the component (HB) may be larger than the (meth)acryloyl group equivalent of the urethane (meth)acrylate used as the component (HA). The specific (meth)acryloyl group equivalent of the urethane (meth) acrylate used as the component (HB) is, for example, 120 g/eq or more and 250 g/eq or less, preferably 135 g/eq or more and 220 g/eq or less, and more preferably 150 g/eq or more and 200 g/eq or less. In the case where the (meth) acryloyl group equivalent of the urethane (meth)acrylate used as the component (HB) is in the range, good flatness of the film can be secured.

In the curable resin composition (α), the content ratio (HA/HB) of the modifier (HB) to the (meth)acrylate (HA) in terms of mass ratio is preferably 3/97 or more and 45/55 or less, more preferably 5/95 or more and 35/65 or less, and further preferably 10/90 or more and 25/75 or less. In the case where the content ratio (HA/HB) is in the range, the flatness of the film can be easily improved.

In the curable resin composition (α), the component (HA) and the component (HB) are major components, and the total amount of the component (HA) and the component (HB) may be 50% by mass or more, preferably 70% by mass or more and 99% by mass or less, and more preferably 80% by mass or more and 97% by mass or less, based on the total solid content of the curable resin composition (α).

(Solvent (HC))

The curable resin composition (α) may be formed into a coating liquid by diluting with a solvent (HC). The curable resin composition (α) formed into a coating liquid in a liquid state may be coated on the base film and then dried and cured to form the cured resin layer. The components (such as the components (HA) and (HB)) constituting the curable resin composition (α) may be dissolved in a solvent, or may be dispersed in a solvent. In the case where the coating liquid diluted with a solvent is dried and cured to form the cured resin layer, there may be a case where wrinkles, curl, and the like occur, but wrinkles and curl due to drying and curing the coating liquid can be prevented from occurring by combining the components (HA) and (HB) to form the curable resin composition (α).

The solvent is preferably an organic solvent. Examples of the organic solvent include an aromatic-based solvent, such as toluene and xylene; a ketone-based solvent, such as methyl ethyl ketone (MEK), acetone, methyl isobutyl ketone (MIBK), cyclohexanone, and diisobutyl ketone; an ether-based solvent, such as diethyl ether, isopropyl ether, tetrahydrofuran, dioxane, ethylene glycol dimethyl ether, ethylene glycol diethyl ether, diethylene glycol dimethyl ether, diethylene glycol diethyl ether, propylene glycol monomethyl ether (PGM), anisole, and phenetole; an ester-based solvent, such as ethyl acetate, butyl acetate, isopropyl acetate, and ethylene glycol diacetate; an amide-based solvent, such as dimethylformamide, diethylformamide, dimethylacetamide, and N-methylpyrrolidone; a cellosolve-based solvent, such as methyl cellosolve, ethyl cellosolve, and butyl cellosolve; an alcohol-based solvent, such as methanol, ethanol, propanol, isopropanol, and butanol; and a halogen-based solvent, such as dichloromethane and chloroform. One of the organic solvents may be used alone, or two or more thereof may be used in combination. Among the organic solvents, an ester-based solvent, an ether-based solvent, an alcohol-based solvent, and a ketone-based solvent are preferably used.

The amount of the organic solvent used is not particularly limited, and may be appropriately determined in consideration of the coatability of the curable resin composition (α) to be prepared, the viscosity and the surface tension of the liquid, the compatibility of the solid contents, and the like. The curable resin composition (α) is preferably prepared in the form of a coating liquid by using the solvent to have a concentration of a solid content of 15 to 80% by mass, and more preferably 20 to 70% by mass. The "solid content" in the curable resin composition means the components except for the solvent, which is a volatile component, and includes not only the solid components, but also a semisolid and a viscous liquid matter.

(Additional Component (HD))

The curable resin composition (α) may appropriately contain various additives depending on necessity in such a range that does not impair the gist of the present invention. Examples of the additives to be used in combination include a photoinitiator, a light stabilizer, an antioxidant, an antistatic agent, an organic pigment, organic particles, inorganic particles, a flame retarder, a leveling agent, a dispersant, a thixotropy imparting agent (thickening agent), and an antifoaming agent.

=Photoinitiator=

In the case where the curable resin composition (α) is a photocurable resin composition, the curable resin composition (α) preferably contains a photoinitiator for enhancing the curability. The photoinitiator is a photopolymerization initiator, and a known material may be used therefor. Examples of the photopolymerization initiator include a photoradical generator and a photoacid generator.

As the photopolymerization initiator that can be used in the curable resin composition (α), examples of the photoradical generator include benzoin and an alkyl ether compound thereof, such as benzoin, benzoin methyl ether, benzoin ethyl ether, and benzoin isopropyl ether; an alkylphenone compound, such as acetophenone, 2,2-dimethoxy-2-phenylacetophenone (for example, "Omnirad (registered trade name) 651", available from IGM Resins B.V.), 2,2-diethoxy-2-phenylacetophenone, 1,1-dichloroacetophenone, 1-hydroxycyclohexyl phenyl ketone (for example, "Omnirad (registered trade name) 184", available from IGM Resins B.V.), 2-hydroxy-2-methyl-1-phenylpropnan-1-one (for example, "Omnirad (registered trade name) 1173", available from IGM Resins B.V.), 2-hydroxy-1-(4-(4-(2-hydroxy-2-methylpropionyl)benzyl)phenyl)-2-methylpropan-1-one (for example, "Omnirad (registered trade name) 127", available from IGM Resins B.V.), 1-[4-(2-hydroxyethoxy)phenyl]-2-hydroxy-2-methyl-1-propan-1-one (for example, "Omnirad (registered trade name) 2959", available from IGM Resins B.V.), 2-methyl-1-[4-(methylthio)phenyl]-2-morpholinopropan-1-one (for example, "Omnirad (registered trade name) 907", available from IGM Resins B.V.), and 2-benzyl-2-dimethylamino-1-(4-morpholinophenyl)-1-butanone; a phosphine oxide compound, such as 2,4,6-trimethylbenzoyldiphenylphosphine oxide (for example, "Omnirad (registered trade name) TPO", available from IGM Resins B.V.), and bis(2,6-dimethoxybenzoyl)-2, 4,4-trimethylpentylphosphine oxide (for example, "Omnirad (registered trade name) 819", available from IGM Resins B.V.); an anthraquinone compound, such as 2-methylanthraquinone, 2-ethylanthraquinone, 2-tert-butylanthraquinone, 1-chloroanthraquinone, and 2-amylanthraquinone; benzophenone and various derivatives thereof; and a formic acid derivative, such as methyl benzoylformate and ethyl benzoylformate. One of these compounds may be used alone, or two or more thereof may be used in combination.

Among these photoradical generators, from the viewpoint of the light resistance of the cured article, preferred include an alkylphenone compound, a phosphine oxide compound, and a formic acid derivative, more preferred include 1-hydroxycyclohexyl phenyl ketone, 2-hydroxy-1-(4-(4-(2-hydroxy-2-methylpropionyl)benzyl)phenyl)-2-methylpropan-1-one, 2-methyl-1-[4-(methylthio)phenyl]-2-morpholinopropan-1-one, 2,4,6-trimethylbenzoyldiphenylphosphine oxide, bis(2,6-dimethoxybenzoyl)-2,4,4-trimethylpentylphosphine oxide, and methyl benzoylformate, and particularly preferred include 1-hydroxycyclohexyl phenyl ketone and 2-hydroxy-1-(4-(4-(2-hydroxy-2-methylpropionyl)benzyl)phenyl)-2-methylpropan-1-one.

A known photoacid generator may be used, and in particular, a diaryl iodonium salt and a triarylsulfonium salt are preferred from the viewpoint of the curability, the acid generation efficiency, and the like. Specific examples thereof include an anionic salt (specific examples of which include PF6 salt, SbF5 salt, and tetrakis(perfluorophenyl) borate) of a di(alkyl-substituted)phenyl iodonium. As a specific examples of the anionic salt of an (alkyl-substituted)phenyl iodonium, PF6 salt of dialkylphenyl iodonium (for example, "Omnirad (registered trade name) 250", available from IGM Resins B.V.) is particularly preferred. One of the photoacid generators may be used alone, or two or more thereof may be used in combination.

The content of the photoinitiator is preferably 0.01 part by mass or more, more preferably 0.1 part by mass or more, and particularly preferably 1 part by mass or more, per 100 parts by mass in total of the compound having a (meth)acryloyl group in the curable resin composition (α), from the viewpoint of the enhancement of the curability. The content thereof is preferably 10 parts by mass or less, more preferably 7 parts by mass or less, and particularly preferably 5 parts by mass or less, from the viewpoint of the retention of the stability of the coating liquid in the case where the curable resin composition (α) is formed into a solution, and the viewpoint of the flatness of the cured coating film.

The curable resin composition (α) may contain a resin other than the components (HA) and (HB) described above, in such a range that does not impair the effects of the present invention.

However, the cured resin layer is preferably an acrylic-based resin layer constituted by an acrylic-based resin as a major component resin. The major component resin means a resin that has the largest mass ratio in the resins constituting the cured resin layer, and it suffices that the resin occupies 50% by mass or more, 75% by mass or more, 90% by mass or more, or 100% by mass of the resins constituting the cured resin layer.

[Thickness of Cured Resin Layer]

The thickness of the cured resin layer is preferably 1 μm or more and 10 μm or less, more preferably 1 μm or more and 8 μm or less, further preferably 1 μm or more and 6 μm or less, and still further preferably 1 μm or more and 4 μm or less. In the case where the thickness of the cured resin layer is the lower limit value or more, the base film can be appropriately protected with the cured resin layer, and the weather resistance and the like can be easily improved. In the case where the thickness of the cured resin layer is the upper limit value or less, curl, thermal wrinkles, and the like of the present laminated film can be prevented to secure good flatness.

[Formation Method of Cured Resin Layer]

The cured resin layer can be obtained in such a manner that the curable resin composition is coated on the surface of the base film, and dried to form a coating layer, and the coating layer is cured.

The method of coating the curable resin composition may be a known coating method, such as air doctor coating, blade coating, rod coating, bar coating, knife coating, squeeze coating, dip coating, reverse roll coating, transfer roll coating, gravure coating, kiss coating, cast coating, spray coating, curtain coating, calender coating, and extrusion coating.

The drying condition is not particularly limited, and may be around room temperature or under heating, for example, at around 25 to 120° C., preferably 50 to 100° C., and more preferably 60 to 90° C. The drying time is not particularly limited, as far as the solvent can be sufficiently evaporated, and may be, for example, around 10 seconds to 30 minutes, and preferably around 15 seconds to 10 minutes.

The curing method of the curable resin composition may be appropriately selected depending on the curing mechanism of the curable resin composition, and in the case where the curable resin composition is a thermally curable resin composition, the curable resin composition may be cured by heating. In the case where the curable resin composition is a photocurable resin composition, the photocurable resin composition may be cured through irradiation of an energy radiation.

In the laminated film of the present invention, the active energy radiation that can be used in curing the curable resin composition include an ultraviolet ray, an electron beam, an X-ray, an infrared ray, and a visible ray. In these active energy radiations, an ultraviolet ray and an electron beam are preferred from the viewpoint of the curability and the prevention of deterioration of the resin.

In the curing method of the curable resin composition, among these, curing through irradiation of an energy radiation is preferred from the viewpoint of the molding time and the productivity, the viewpoint of the prevention of thermal shrinkage and thermal deterioration of the components under heating, and the like. The irradiation of an energy radiation may be performed from any side, i.e., may be performed from the side of the base film, or may be performed from the side opposite to the base film.

In the production of the laminated film of the present invention, in the case where the curable resin composition is cured by ultraviolet ray irradiation, various ultraviolet ray irradiation equipments may be used, in which the light source thereof used may be a xenon lamp, a high pressure mercury lamp, a metal halide lamp, an LED-UV lamp, or the like. The irradiation dose of an ultraviolet ray (unit: $mJ/cm^2$) is generally 50 to 3,000 $mJ/cm^2$, and may be appropriately determined depending on the reaction rate of the (meth) acryloyl group that is necessary in the process step, preferably from a range of 100 to 1,000 $mJ/cm^2$ from the viewpoint of the curability of the curable resin composition and the flexibility and the like of the cured article (cured membrane), and more preferably from a range of 100 to 500 $mJ/cm^2$ from the viewpoint of the flatness of the laminated film.

In the production of the laminated film of the present invention, in the case where the curable resin composition is cured by electron beam irradiation, various electron beam irradiation equipments may be used. The irradiation dose of an electron beam (Mrad) is generally 0.5 to 20 Mrad, and may be appropriately determined depending on the reaction rate of the (meth)acryloyl group that is necessary in the process step, preferably from a range of 1 to 15 Mrad from the viewpoint of the curability of the curable resin composition, the flexibility of the cured article, the prevention of damage of the base material, and the like.

3. Additional Layers

The present laminated film may include various functional layers, such as a highly adhesive layer and a slippery layer, in addition to the base film and the cured resin layer.

[Highly Adhesive Layer]

In the case where the present laminated film includes a highly adhesive layer, the highly adhesive layer may be provided on one surface of the base film having the cured resin layer provided thereon, and the cured resin layer may be formed on the surface of the highly adhesive layer.

The highly adhesive layer provided can facilitate the adhesion of the cured resin layer to the base film. The highly adhesive layer may be formed of a highly adhesive layer composition containing a binder resin and a crosslinking agent.

Examples of the binder resin include a polyester resin, an acrylic resin, a urethane resin, a polyvinyl-based resin such as polyvinyl alcohol, polyalkylene glycol, polyalkyleneimine, methyl cellulose, hydroxy cellulose, and starch. Among these, a polyester resin, an acrylic resin, or a urethane resin is preferably used, and a polyester resin or an acrylic resin is more preferably used, from the viewpoint of the enhancement of the adhesiveness to the cured resin layer. One of these binder resins may be used alone, or two or more thereof may be used in combination. In the highly adhesive layer, the content of the binder resin is, for example, 20 to 90% by mass, and preferably 30 to 80% by mass, based on the solid content.

The crosslinking agent used may be various known crosslinking agents, and examples thereof include an oxazoline compound, a melamine compound, an epoxy compound, an isocyanate-based compound, a carbodiimide-based compound, and a silane coupling compound. The oxazoline compound may be an acrylic polymer or the like having an oxazoline group.

Among these, a melamine compound, an oxazoline compound, and an epoxy compound are preferred. One of these crosslinking agents may be used alone, or two or more thereof may be used in combination.

In the highly adhesive layer, the content of the crosslinking agent is, for example, 5 to 50% by mass, and preferably 10 to 40% by mass, based on the solid content.

The highly adhesive layer composition may contain particles for the purpose of improving the anti-blocking capability and the slipperiness. The particles used may be selected from those shown for the slippery layer described later. However, the highly adhesive layer composition (i.e., the highly adhesive layer) preferably contains substantially no particle. Substantially no particle contained can enhance the smoothness of the surface of the cured resin layer.

The highly adhesive layer composition may contain a component that accelerates the crosslinking, such as a crosslinking catalyst. Furthermore, an anti-foaming agent, a coating property improver, a thickening agent, an organic lubricant, an antistatic agent, an ultraviolet ray absorbent, an antioxidant, a foaming agent, a dye, a pigment, and the like may also be used in combination.

The highly adhesive layer composition is preferably diluted with water, an organic solvent, or a mixture thereof, and the highly adhesive layer may be formed in such a manner that a diluted liquid of the highly adhesive layer composition as a coating liquid is coated on the surface of the base film, and then dried. The coating may be performed by a known method. The thickness of the highly adhesive layer is generally in a range of 0.003 to 1 μm, preferably 0.005 to 0.6 μm, and more preferably 0.01 to 0.4 μm. In the case where the thickness is 0.003 μm or more, sufficient adhesiveness can be secured. In the case where the thickness is 1 μm or less, deterioration of the appearance, blocking, and the like can be prevented from occurring.

[Slippery Layer]

In the case where the present laminated film includes a slippery layer, the slippery layer may be provided on the surface of the base film opposite to the surface having the cured resin layer provided thereon. The slippery layer may be provided on the surface of the base film. The slippery layer improves the slipperiness of the laminated film. Even in the case where the smoothness of the surface of the laminated film having the cured resin layer provided thereon is improved to make high smoothness in advance as described above, the slippery layer provided can improve the roll winding capability and the handleability of the laminated film.

The slippery layer may be formed, for example, from a slippery layer composition containing a binder resin, a crosslinking agent, and particles. The compounds that can be used as the binder resin and the crosslinking agent have been described for the binder resin and the crosslinking agent used in the highly adhesive layer.

The content of the binder resin in the slippery layer is, for example, 20 to 90% by mass, and preferably 30 to 80% by mass, based on the solid content. The content of the crosslinking agent in the slippery layer composition is, for example, 5 to 50% by mass, and preferably 10 to 40% by mass, based on the solid content.

Specific examples of the particles used in the slippery layer include silica, alumina, kaolin, calcium carbonate, and organic polymer particles. Among these, silica is preferred from the viewpoint of the transparency. The average particle diameter of the particles is preferably in a range of 0.005 to 1.0 μm, more preferably 0.01 to 0.8 μm, and further preferably 0.01 to 0.6 μm, from the viewpoint of the improvement of the slipperiness without impairing the smoothness on the surface of the base film. The content of the particles in the slippery layer composition is, for example, 1 to 20% by mass, and preferably 3 to 15% by mass, based on the solid content. One of the particles used in the slippery layer may be used alone, or two or more thereof may be used in combination.

The slippery layer composition is preferably diluted with water, an organic solvent, or a mixture thereof, and the slippery layer may be formed in such a manner that a diluted liquid of the slippery layer composition as a coating liquid is coated on the surface of the base film, and then dried. The coating may be performed by a known method.

The thickness of the slippery layer is generally in a range of 0.003 to 1 μm, preferably 0.005 to 0.6 μm, and more preferably 0.01 to 0.4 μm. In the case where the thickness is 0.003 μm or more, the particles contained in the slippery layer can be sufficiently retained to impart slipperiness. In the case where the thickness is 1 μm or less, deterioration of the appearance, blocking, and the like can be prevented from occurring.

The surface of the base film may be subjected to a coating operation depending on necessity, and the highly adhesive layer and the slippery layer described above may be formed by the coating operation. The coating operation may be performed in-line, off-line, or by the combination thereof, and is preferably performed in-line. The in-line coating operation may be performed in such a manner that the base film is subjected to the coating operation in the production line of the base film. For example, in the case where the base film is a biaxially stretched film, for example, in the stage where the longitudinal stretching is completed, the coating liquid for forming at least one of the highly adhesive layer and the slippery layer is coated, and then the coating liquid is dried and cured in the following production process of the base film.

<Surface Protection Film for Liquid Crystal Polarizing Film>

Figure 2:
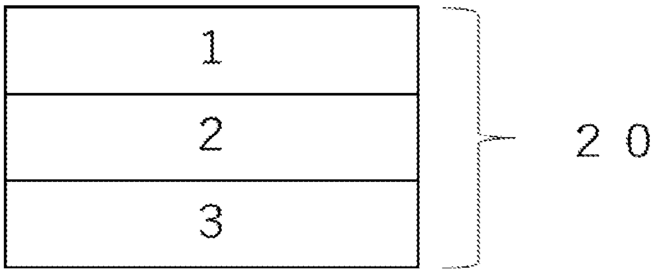
FIG. 2 is a schematic cross-sectional view showing one example of the surface protection film for a liquid crystal polarizing film of the present invention.

FIG. 2 shows one example of the surface protection film for a liquid crystal polarizing film according to the present invention (which may be hereinafter referred to as a "present surface protection film"). The present surface protection film 20 includes a cured resin layer 1 provided on one surface of the base film 2, and an adhesive layer 3 provided on the other surface of the base film 2.

The present surface protection film 20 may further include a release film laminated on the surface of the adhesive layer 3.

The adhesive layer and the release film will be described in detail below.

1. Adhesion Layer

The adhesive layer in the present surface protection film is formed from an adhesive composition. The adhesive composition preferably contains a (meth)acrylic-based polymer (A).

[(Meth)Acrylic-Based Polymer (A)]

Examples of the (meth)acrylic-based polymer (A) include a homopolymer of an alkyl (meth)acrylate, and also include a copolymer obtained through copolymerization with a copolymerizable monomer component. Examples of the copolymer include a copolymer obtained through copolymerization of an alkyl (meth)acrylate (a1) having a side chain having 4 to 18 carbon atoms as a major component, and a copolymerizable monomer.

The major component described above means a component that largely influences the characteristics of the (meth) acrylic-based polymer (A), and the content of the component is generally 30% by mass or more, and preferably 35% by mass or more, based on the total of the (meth)acrylic-based polymer (A).

The (meth)acrylic-based polymer (A) may contain two or more of (meth)acrylic-based polymers having different glass transition temperatures from the viewpoint of the securement of the processability, the adhesion force, the stress relaxation capability, the heat resistant reliability, and the hygrothermal haze resistance.

Examples of the alkyl (meth)acrylate (a1) having a side chain having 4 to 18 carbon atoms include a linear alkyl (meth)acrylate, such as n-butyl (meth)acrylate, pentyl (meth)acrylate, hexyl (meth)acrylate, heptyl (meth)acrylate, n-octyl (meth)acrylate, nonyl (meth)acrylate, decyl (meth) acrylate, undecyl (meth)acrylate, lauryl (meth)acrylate, tridecyl (meth)acrylate, tetradecyl (meth)acrylate, cetyl (meth) acrylate, and stearyl (meth)acrylate, a branched alkyl (meth) acrylate, such as isobutyl (meth)acrylate, sec-butyl (meth) acrylate, t-butyl (meth)acrylate, isopentyl (meth)acrylate, neopentyl (meth)acrylate, 2-ethylhexyl (meth)acrylate, isooctyl (meth)acrylate, isononyl (meth)acrylate, isodecyl (meth)acrylate, and isostearyl (meth)acrylate, and an alicyclic alkyl (meth)acrylate, such as cyclohexyl (meth)acrylate, t-butylcyclohexyl (meth)acrylate, 3,5,5-trimethylcyclohexane (meth)acrylate, dicyclopentanyl (meth)acrylate, dicyclopentenyl (meth)acrylate, dicyclopentenyloxyethyl (meth)acrylate, and isobornyl (meth)acrylate. One of these compounds may be used alone, or two or more thereof may be used in combination.

The content of the alkyl (meth)acrylate (a1) is preferably 3% by mass or more, more preferably 5% by mass or more, further preferably 8% by mass or more, particularly preferably 10% by mass or more, and most preferably 12% by mass or more, based on the total components of the (meth) acrylic-based polymer (A), from the viewpoint of the enhancement of the stress relaxation capability and the heat resistant reliability in the form of the adhesive layer.

The content of the alkyl (meth)acrylate (a1) is preferably 90% by mass or less, more preferably 85% by mass or less, further preferably 80% by mass or less, particularly preferably 75% by mass or less, and most preferably 70% by mass or less, based on the total components of the (meth)acrylic-based polymer (A), from the viewpoint of the suppression of decrease in adhesion force.

In the case where plural of the alkyl methacrylates (a1) are contained, it suffices that the total amount thereof satisfies the aforementioned content range.

Examples of the monomer component copolymerizable with the alkyl (meth)acrylate (a1) having a side chain having 4 to 18 carbon atoms include a hydroxy group-containing (meth)acrylate monomer (a2), a (meth)acrylate monomer or vinyl ester-based monomer having a side chain having 1 to 3 carbon atoms (a3), a functional group-containing ethylenic unsaturated monomer (a4), and an additional copolymerizable monomer (a5).

Examples of the hydroxy group-containing (meth)acrylate monomer (a2) include a primary hydroxy group-containing monomer, for example, a hydroxy (meth)acrylate, such as 2-hydroxyethyl (meth)acrylate, 4-hydroxybutyl (meth)acrylate, 5-hydroxypentyl (meth)acrylate, 6-hydroxyhexyl (meth)acrylate, and 8-hydroxyoctyl (meth)acrylate, a caprolactone-modified monomer, such as caprolactone-modified 2-hydroxyethyl (meth)acrylate, an oxyalkylene-modified monomer, such as diethylene glycol (meth)acrylate and polyethylene glycol (meth)acrylate, 2-acryloyloxyethyl-2-hydroxyethyl phthalate; a secondary hydroxy group-containing monomer, for example, 2-hydroxypropyl (meth) acrylate, 2-hydroxybutyl (meth)acrylate, and 3-chloro-2-hydroxypropyl (meth)acrylate; and a tertiary hydroxy group-containing monomer, for example, 2,2-dimethyl-2-hydroxyethyl (meth)acrylate. These compounds each may be used alone, or two or more thereof may be used in combination.

In the hydroxy group-containing monomer (a2), a primary hydroxy group-containing monomer, particularly 2-hydroxyethyl (meth)acrylate, 4-hydroxybutyl (meth)acrylate, and 2-hydroxypropyl (meth)acrylate, and more particularly 2-hydroxyethyl (meth)acrylate and 4-hydroxybutyl (meth) acrylate, are preferred from the viewpoint of the excellent in balance between the hygrothermal resistance and the heat resistance.

The lower limit value of the content of the hydroxy group-containing monomer (a2) is generally 3% by mass or more, preferably 5% by mass or more, more preferably 8% by mass or more, further preferably 10% by mass or more, and particularly preferably 12% by mass or more, based on the total components of the (meth)acrylic-based polymer (A), from the viewpoint of the enhancement of the hygrothermal resistance.

The upper limit value of the content of the hydroxy group-containing monomer (a2) is generally 60% by mass or less, preferably 45% by mass or less, more preferably 35% by mass or less, further preferably 30% by mass or less, and particularly preferably 28% by mass or less, from the viewpoint of the suppression of the self-crosslinking reaction of the adhesive composition, and the enhancement of the processability and the heat resistant reliability.

In the case where plural of the hydroxy group-containing monomers (a2) are contained, it suffices that the total amount thereof satisfies the aforementioned content range.

Examples of the (meth)acrylate monomer or vinyl ester-based monomer having a side chain having 1 to 3 carbon atoms (a3) include methyl (meth)acrylate, ethyl (meth) acrylate, n-propyl (meth)acrylate, isopropyl (meth)acrylate, vinyl propionate, and vinyl acetate. The monomers (a3) each may be used alone, or two or more thereof may be used in combination.

In the component (a3), methyl (meth)acrylate and ethyl (meth)acrylate are preferably used from the viewpoint of the enhancement of the cohesive force in the use as an adhesive.

In the case where the component (a3) is contained, the lower limit value of the content thereof is preferably 5% by mass or more, more preferably 7% by mass or more, and further preferably 10% by mass or more, based on the total components of the (meth)acrylic-based polymer (A), from the viewpoint of the enhancement of the cohesive force in the use as an adhesive. In the case where the component (a3) is contained, the upper limit value of the content thereof is preferably 40% by mass or less, more preferably 30% by mass or less, and further preferably 20% by mass or less, based on the total components of the (meth)acrylic-based polymer (A), from the viewpoint of the enhancement of the processability.

In the case where plural of the components (a3) are contained, it suffices that the total amount thereof satisfies the aforementioned content range.

Examples of the functional group-containing ethylenic unsaturated monomer (a4) include a carboxy group-containing monomer, a nitrogen atom-containing functional group-containing monomer, an acetoacetyl group-containing monomer, an isocyanate group-containing monomer, and a glycidyl group-containing monomer.

Among these, a nitrogen atom-containing functional group-containing monomer is preferred, an amino group-containing monomer and an amide group-containing monomer are more preferred, and an amino group-containing monomer is further preferred, from the viewpoint of the achievement of the cohesive force and the crosslinking accelerating effect.

Examples of the carboxyl group-containing monomer include (meth)acrylic acid, carboxyethyl (meth)acrylate, 2-(meth)acryloyloxyethyl hexahydrophthalate, 2-(meth) acryloyloxypropyl hexahydrophthalate, 2-(meth)acryloyloxyethyl phthalate, 2-(meth)acryloyloxypropyl phthalate, 2-(meth)acryloyloxyethyl maleate, 2-(meth)acryloyloxypropyl maleate, 2-(meth)acryloyloxyethyl succinate, 2-(meth) acryloyloxypropyl succinate, crotonic acid, fumaric acid, maleic acid, itaconic acid, monomethyl maleate, and monomethyl itaconate.

Examples of the amino group-containing monomer include a primary amino group-containing (meth)acrylate, such as aminomethyl (meth)acrylate and aminoethyl (meth) acrylate; a secondary amino group-containing (meth)acrylate, such as t-butylaminoethyl (meth)acrylate and t-butylaminopropyl (meth)acrylate; and a tertiary amino group-containing (meth)acrylate, such as ethylaminoethyl (meth) acrylate, dimethylaminoethyl (meth)acrylate, diethylaminoethyl (meth)acrylate, dimethylaminopropyl (meth)acrylate, diethylaminopropyl (meth)acrylate, and dimethylaminopropylacrylamide.

Examples of the amide group-containing monomer include (meth)acrylamide; an N-alkyl(meth)acrylamide, such as N-methyl(meth)acrylamide, N-ethyl(meth)acrylamide, N-propyl(meth)acrylamide, N-n-butyl(meth)acrylamide, diacetone(meth)acrylamide and N,N'-methylenebis (meth)acrylamide; an N,N-dialkyl(meth)acrylamide, such as N,N-dimethyl(meth)acrylamide, N,N-diethyl(meth)acrylamide, N,N-dipropyl(meth)acrylamide, N,N-ethylmethyl (meth)acrylamide, and N,N-diallyl(meth)acrylamide; a hydroxyalkyl(meth)acrylamide, such as N-hydroxymethyl (meth)acrylamide and N-hydroxyethyl(meth)acrylamide; and an alkoxyalkyl(meth)acrylamide, such as N-methoxymethyl(meth)acrylamide and N-(n-butoxymethyl) (meth)acrylamide.

Examples of the acetoacetyl group-containing monomer include 2-(acetoacetoxy)ethyl (meth)acrylate and allyl acetoacetate.

Examples of the isocyanate group-containing monomer include 2-acryloyloxyethyl isocyanate, 2-methacryloyloxyethyl isocyanate, and alkylene oxide adducts thereof. The isocyanate group may be protected with a blocking agent, such as methyl ethyl ketone oxime, 3,5-dimethylpyrazole, 1,2,4-triazole, and diethyl malonate.

Examples of the glycidyl group-containing monomer include glycidyl (meth)acrylate and allylglycidyl (meth) acrylate.

The functional group-containing ethylenic unsaturated monomers (a4) each may be used alone, or two or more thereof may be used in combination.

The upper limit value of the content of the functional group-containing ethylenic unsaturated monomers (a4) is preferably 30% by mass or less, more preferably 20% by mass or less, further preferably 10% by mass or less, and particularly preferably 5% by mass or less, based on the total components of the (meth)acrylic-based polymer (A), from the viewpoint of the enhancement of the heat resistance and the light resistance of the adhesive composition.

In the case where plural of the functional group-containing ethylenic unsaturated monomer components (a4) are contained, it suffices that the total amount thereof satisfies the aforementioned content range.

In the present invention, an additional copolymerizable monomer (a5) may be used depending on necessity as a copolymerization component of the acrylic-based resin.

Examples of the additional copolymerizable monomer (a5) include an aromatic (meth)acrylate ester-based monomer, such as phenyl (meth)acrylate, benzyl (meth)acrylate, phenoxyethyl (meth)acrylate, phenyldiethylene glycol (meth)acrylate, phenoxypolyethylene glycol (meth)acrylate, phenoxypolyethylene glycol-polypropylene glycol (meth) acrylate, and nonylphenol ethylene oxide adduct (meth) acrylate, a (meth)acrylate ester-based monomer having a benzophenone structure, such as 4-acryloyloxybenzophenone, 4-acryloyloxyethoxybenzophenone, 4-acryloyloxy-4'-methoxybenzophenone, 4-acryloyloxyethoxy-4'-methoxybenzophenone, 4-acryloyloxy-4'-bromobenzophenone, 4-acryloyloxyethoxy-4'-bromobenzophenone, 4-methacryloyloxybenzophenone, 4-methacryloyloxyethoxybenzophenone, 4-methacryloyloxy-4'-methoxybenzophenone, 4-methacryloyloxyethoxy-4'-methoxybenzophenone, 4-methacryloyloxy-4'-bromobenzophenone, 4-methacryloyloxyethoxy-4'-bromobenzophenone, and mixtures thereof, and a vinyl-based monomer, such as acrylonitrile, methacrylonitrile, styrene, α-methylstyrene, vinyl stearate, vinyl chloride, vinylidene chloride, an alkyl vinyl ether, vinyltoluene, vinylpyridine, vinylpyrrolidone, a dialkyl itaconate, dialkyl fumarate, allyl alcohol, acrylic chloride, methyl vinyl ketone, N-acrylamidemethyltrimethylammonium chloride, allyltrimethylammonium chloride, and dimethylallyl vinyl ketone. These compounds each may be used alone, or two or more thereof may be used in combination.

The upper limit value of the content of the copolymerizable monomer (a5) is preferably 30% by mass or less, more preferably 20% by mass or less, further preferably 10% by mass or less, and particularly preferably 5% by mass or less, based on the total components of the (meth)acrylic-based polymer (A), from the viewpoint of the enhancement of the heat resistance and the light resistance of the adhesive composition.

In the case where plural of the copolymerizable monomers (a5) are contained, it suffices that the total amount thereof satisfies the aforementioned content range.

The (meth)acrylic-based polymer (A) of the present invention may have a polymerizable carbon double bond group introduced to the side chain thereof. According to the configuration, the crosslinking sensitivity of the present adhesive composition can be enhanced, and the present adhesive composition can be crosslinked through irradiation of an active energy radiation with lower energy, thereby imparting the cohesive force and the heat resistance.

Examples of the method of introducing a polymerizable carbon double bond group to the side chain of the (meth) acrylic-based polymer (A) include a method in which a copolymer containing the hydroxy group-containing (meth) acrylate monomer (a2) or the functional group-containing ethylenic unsaturated monomer (a4) is prepared, and then a compound (a6) having a functional group capable of being reacted with the functional group and a polymerizable carbon double bond group is condensed or added thereto while retaining the activity of the polymerizable carbon double bond group.

Examples of the combination of functional groups include an epoxy group (glycidyl group) and a carboxy group, an amino group and a carboxy group, an amino group and an isocyanate group, an epoxy group (glycidyl group) and an amino group, a hydroxy group and an epoxy group, and a hydroxy group and an isocyanate group. Among the combinations of functional groups described above, the combination of a hydroxy group and an isocyanate group is preferred, from the viewpoint of easier to control reaction. Specifically, a combination in which the copolymer has a hydroxy group, and the compound has an isocyanate group is preferred.

Examples of the isocyanate compound having a polymerizable carbon double bond group include 2-acryloyloxyethyl isocyanate, 2-methacryloyloxyethy isocyanate, and alkylene oxide adducts thereof described above.

The amount of the compound (a6) added is preferably 10 parts by mass or less, more preferably 8 parts by mass or less, further preferably 5 parts by mass or less, and particularly preferably 3 parts by mass or less, per 100 parts by mass of the (meth)acrylic-based polymer (A), from the viewpoint of the enhancement of the adhesiveness and the stress relaxation capability.

The mass average molecular weight of the (meth)acrylic-based polymer (A) is preferably 100,000 or more, more preferably 300,000 or more, and further preferably 500,000 or more, from the viewpoint of the achievement of the adhesive composition having a high cohesive force.

The upper limit value of the mass average molecular weight of the (meth)acrylic-based polymer (A) is preferably 2,000,000 or less, more preferably 1,500,000 or less, and further preferably 1,000,000 or less, from the viewpoint of the achievement of the adhesive composition having a high fluidity and a high stress relaxation capability.

[Curable Compound (B)]

The adhesive composition preferably further contains a curable compound (B).

The curable compound (B) is a compound having a property of curing with heat or light irradiation. In the present adhesive composition, the curable compound (B) preferably forms a crosslinked structure with the (meth) acrylic-based (co)polymer (A).

The curable compound (B) is preferably a compound having an ethylenic unsaturated group in the molecule thereof from the viewpoint of the formation of a crosslinked structure with the (meth)acrylic-based (co)polymer (A) through curing. The curable compound (B) is particularly preferably a (meth)acrylate, and more particularly preferably a monofunctional (meth)acrylate.

The monofunctional (meth)acrylate herein means a (meth)acrylate having one (meth)acryloyl group, and a polyfunctional (meth)acrylate means a (meth)acrylate having two or more (meth)acryloyl groups.

The curable compound (B) preferably forms a polymer obtained through homopolymerization thereof that has a glass transition temperature of −40° C. or less, and more preferably −45° C. or less.

In the case where the curable compound (B) has a glass transition temperature within the range, the glass transition temperature of the (meth)acrylic-based (co)polymer (A) can be set to a relatively high value, and thereby such flexibility that resists buckling in bending deformation can be imparted while securing the adhesiveness, thereby providing the adhesive layer having flex resistance.

The curable compound (B) is preferably a (meth)acrylate having a glycol skeleton. A (meth)acrylate having a glycol skeleton can easily reduce the glass transition temperature after curing, and can easily impart flexibility and the like by regulating the molecular weight of the skeleton component.

Examples of the glycol skeleton include an ethylene glycol skeleton, a propylene glycol skeleton, a diethylene glycol skeleton, a butanediol skeleton, a hexanediol skeleton, 1,4-cyclohexanedimethanol skeleton, a glycolic acid skeleton, and a polyglycol skeleton. Among these, a polyethylene glycol skeleton and/or a polypropylene glycol skeleton are particularly preferred.

The curable compound (B) is preferably a (meth)acrylate having a mass average molecular weight (Mw) of 5,000 or more, more preferably 7,000 or more, and further preferably 9,000 or more.

In the case where the curable compound (B) is the (meth)acrylate of this type, the skeleton including a long linear structure can provide a curable compound having a low glass transition temperature, which can impart good flexibility to the adhesive layer.

A urethane (meth)acrylate having a glycol skeleton having a mass average molecular weight of 5,000 or more is preferred, which is more preferably 7,000 or more, and further preferably 9,000 or more. The urethane (meth) acrylate of this type can also impart good wettability to an adherend.

The curable compound (B) is preferably contained in a proportion of more than 15 parts by mass and less than 75 parts by mass per 100 parts by mass of the (meth)acrylic-based (co)polymer (A). In the case where the curable compound (B) is contained in the proportion, both the adhesion force and the flex resistance can be imparted to the adhesive layer in a well balanced manner.

From this viewpoint, the curable compound (B) is preferably contained in a proportion of more than 15 parts by mass and less than 75 parts by mass, more preferably 20 parts by mass or more and 70 parts by mass or less, and particularly 25 parts by mass or more and 65 parts by mass or less, per 100 parts by mass of the (meth)acrylic-based (co)polymer (A).

Two or more of the curable compounds (B) may be used in combination, and in the case where the curable compounds (B) are used in combination, it suffices that the total amount thereof satisfies the aforementioned content.

[Radical Polymerization Initiator (C)]

The adhesive composition preferably further contains a radical polymerization initiator (C).

It suffices that the radical polymerization initiator (C) can release a substance initiating radical polymerization, through at least one of irradiation of an active energy radiation such as light, and heating. Examples of the thermal radical polymerization initiator include hydrogen peroxide, an organic peroxide such as perbenzoic acid, and an azo compound such as azobisisobutyronitrile.

The photoradical polymerization initiator is classified into two depending on the radical generation mechanism, i.e., roughly classified into a cleavage type photoradical polymerization initiator that generates radicals through cleavage of the single bond of the photoradical polymerization initiator, and a hydrogen-withdrawing photoradical polymerization initiator that forms an excited complex of the photoexcited initiator and a hydrogen donor in the system, and can transfer the hydrogen of the hydrogen donor.

Among these, the cleavage type photoradical polymerization initiator is converted to another compound through decomposition in generating radicals under irradiation of light, and therefore after exciting once, loses the function of a reaction initiator. Accordingly, the cleavage type photoradical polymerization initiator is preferred since no active species remains in the adhesive after completing the crosslinking reaction, providing no possibility of unexpected light deterioration or the like of the adhesive.

On the other hand, the hydrogen-withdrawing photoradical polymerization initiator not only retains the function of a reaction initiator even after the irradiation of light multiple times, but also in generating radicals under irradiation of active energy radiation, such as an ultraviolet ray, does not form a decomposition product as in the cleavage type photoradical polymerization initiator, and therefore the hydrogen-withdrawing photoradical polymerization initiator is useful since no volatile component is formed after completing the reaction, thereby reducing damages on the adherend.

In the case where the photoradical polymerization initiator is used, the initiator preferably generates radicals under irradiation of light in a wavelength range, for example, of 380 nm to 700 nm, so as to becomes a starting point of the crosslinking reaction of the present adhesive composition.

Examples of the cleavage type photoradical polymerization initiator include 2,2-dimethoxy-1,2-diphenylethan-1-one, 1-hydroxycyclohexyl phenyl ketone, 2-hydroxy-2-methyl-1-phenylpropan-1-one, 1-(4-(2-hydroxyethoxy)phenyl)-2-hydroxy-2-methyl-1-propan-1-one, 2-hydroxy-1-[4-{4-(2-hydroxy-2-methylpropionyl)benzyl}phenyl]-2-methylpropan-1-one, oligo(2-hydroxy-2-methyl-1-(4-(1-methylvinyl)phenyl)propanone), methyl phenylglyoxylate, 2-benzyl-2-dimethylamino-1-(4-morpholinophenyl)butan-1-one, 2-methyl-1-[4-(methylthio)phenyl]-2-morpholinopropan-1-one, 2-(dimethylamino)-2-[(4-methylphenyl)methyl]-1-[4-(4-morphlinyl)phenyl]-1-butanone, bis(2,4,6-trimethylbenzoyl)phenylphosphine oxide, 2,4,6-trimethylbenzoyldiphenylphosphine oxide, (2,4,6-trimethylbenzoyl)ethoxyphenylphosphine oxide, and derivatives thereof.

Among these, an acylphosphine oxide-based photoinitiator, such as bis(2,4,6-trimethylbenzoyl)phenylphosphine oxide, 2,4,6-trimethylbenzoyldiphenylphosphine oxide, (2,4,6-trimethylbenzoyl)ethoxyphenylphosphine oxide, and bis(2,6-dimethoxybenzoyl)-2,4,4-trimethylpentylphosphine oxide, is preferred from the viewpoint of the discoloration by becoming a decomposition product after the reaction.

Examples of the hydrogen-withdrawing photoradical polymerization initiator include a benzophenone-based compound, such as benzophenone, 4-methylbenzophenone, 2,4,6-trimethylbenzophenone, 4-phenylbenzophenone, 3,3'-dimethyl-4-methoxybenzophenone, 4-(meth)acryloyloxybenzophenone, 4-[2-((meth)acryloyloxy)ethoxy]benzophenone, 4-(meth)acryloyloxy-4'-methoxybenzophenone, methyl 2-benzoylbenzoate, methyl benzoylformate, bis(2-phenyl-2-oxoacetic acid)oxybisethylene, and 4-(1,3-acryloyl-1,4,7,10,13-pentaoxotridecyl)benzophenone, bis(2-phenyl-2-oxoacetic acid)oxybisethylene, methyl phenylglyoxylate, a mixture of 2-[2-oxo-2-phenylacetoxyethoxy]ethyl oxyphenylacetate and 2-[2-hydroxyethoxy]ethyl oxyphenylacetate, thioxanthone, 2-chlorothioxanthone, 3-methylthioxanthone, 2,4-dimethylthioxanthone, anthraquinone, 2-methylanthraquinone, 2-ethylanthraquinone, 2-tert-butylanthraquinone, 2-aminoanthraquinone, camphorquinone, and derivatives thereof.

Among these, one or two or more selected from the group consisting of 4-methylbenzophenone, methyl phenylglyoxylate, and a mixture of 2-[2-oxo-2-phenylacetoxyethoxy]ethyl oxyphenylacetate and 2-[2-hydroxyethoxy]ethyl oxyphenylacetate is preferred.

The radical polymerization initiator (C) is not limited to the aforementioned substances. One of the aforementioned radical polymerization initiators (C) or a derivative thereof may be used, or two or more thereof may be used in combination. The thermal radical polymerization initiator and the photoradical polymerization initiator may be used in combination.

The content of the radical polymerization initiator (C) is not particularly limited, and is preferably 0.1 part by mass or more, more preferably 0.5 part by mass or more, further preferably 1 part by mass or more, and particularly preferably 2 parts by mass or more, per 100 parts by mass of the (meth)acrylic-based polymer (A), from the viewpoint of the enough progress of the polymerization reaction and the resulting enhancement of the shape stability of the adhesive layer.

The upper limit of the content of the radical polymerization initiator (C) is preferably 15 parts by mass or less, more preferably 10 parts by mass or less, further preferably 6 parts by mass or less, and particularly preferably 4 parts by mass or less, per 100 parts by mass of the (meth)acrylic-based polymer (A), from the viewpoint of the securement of the adhesiveness.

In the case where plural of the radical polymerization initiators are used, it suffices that the total amount thereof satisfies the aforementioned content range.

The adhesive composition is laminated on an optical component, such as a liquid crystal polarizing film, followed by exposing to light, and thus can be used as the adhesive layer.

In the case where the present adhesive composition has active energy radiation curability, the release film is released off from the present surface protection film, and after laminating the adhesive layer and the liquid crystal polarizing film, or after forming a laminate with the liquid crystal polarizing film and another optical component, the present composition is cured through irradiation of light so as to adhere firmly the liquid crystal polarizing film and another optical component, thereby enhancing the reliability of the laminate. The light source used is preferably an ultraviolet ray or visible light from the viewpoint of the suppression of damages on the optical component and the reaction control.

The irradiation measure is not particularly limited, and it is preferred to irradiate with light from the opposite side to the surface having the liquid crystal polarizing film laminated thereon.

The irradiation energy, the irradiation time, the irradiation method, and the like of the active energy radiation are not particularly limited, and it suffices that the initiator can be activated to polymerize the (meth)acrylate.

[Thickness of Adhesion Layer]

The thickness of the adhesive layer is preferably 10 μm or more, more preferably 20 μm or more, further preferably 30 μm or more, and particularly preferably 40 μm or more, from the viewpoint of the protection of the optical component. The upper limit value of the thickness if preferably 175 μm or less, more preferably 120 μm or less, further preferably 80 μm or less, and particularly preferably 60 μm or less, from the viewpoint of the contribution to reduction in the thickness of the image display apparatus.

[Production Method of Adhesion Layer]

One example of the production method of the adhesive layer will be described.

The adhesive layer can be produced in such a manner that the (meth)acrylic-based polymer (A) and depending on necessity the curable compound (B), the radical initiator (C), and the additional components depending on necessity are mixed in the prescribed amounts to prepare an adhesive composition, the composition is formed into a sheet, and depending on necessity, the curable compound (B) is crosslinked, i.e., polymerized, for curing.

In the preparation of the present adhesive composition, the above materials may be kneaded with a kneader capable of controlling the temperature (for example, a single screw extruder, a twin screw extruder, a planetary mixer, a twin screw mixer, and a pressure kneader).

In mixing the materials, the additives each may be fed to the kneader after blending with the resin in advance, may be fed thereto after melt-mixing all the materials in advance, or may be fed thereto in the form of a master batch containing the additive concentrated in the resin.

The method of forming the adhesive composition into a sheet may be a known method, such as a wet lamination method, a dry lamination method, an extrusion casting method using a T-die, an extrusion lamination method, a calender method, an inflation method, an injection molding method, or an injection curing method. Among these, a wet lamination method, an extrusion casting method, and an extrusion lamination method are preferred for producing a sheet.

In the case where the adhesive composition contains a radical initiator, a cured article can be produced by curing the composition by heating and/or irradiating with an active energy radiation. In particular, a molded article, such as a sheet, obtained by molding the present composition may be heated and/or irradiated with an active energy radiation, and thereby the present adhesive sheet can be produced.

Examples of the active energy radiation irradiated therein include an ionizing radiation, such as an α-ray, a β-ray, a γ-ray, a neutron beam, and an electron beam, an ultraviolet ray, and visible light, and an ultraviolet ray and visible light are preferred from the viewpoint of the suppression of damages on the optical member and the reaction control.

The irradiation energy, the irradiation time, the irradiation method and the like of the active energy radiation are not particularly limited, and it suffices that the initiator can be activated to polymerize the (meth)acrylate.

Examples of the preferred formation method of the adhesive layer include a method in which the adhesive composition is coated and dried on a release film described later, and then a release film is further laminated on the composition having been formed into a film, followed by curing the composition through ultraviolet ray radiation.

As another embodiment of the production method of the adhesive layer, the adhesive composition may be dissolved in a suitable solvent, and then coated by various coating methods.

In the case where the coating method is used, the adhesive layer can be obtained by curing through irradiation of the active energy radiation, and can also be obtained by heat curing.

In the coating method, the thickness of the adhesive layer can be regulated by the coating thickness and the solid concentration of the coating liquid.

The adhesive layer may also be formed by directly charging the adhesive composition into between the optical component as the adherend and the present laminated film.

2. Release Film

In the case where the present surface protection film has a release film, the material thereof is not particularly limited, and a known release film may be appropriately used.

Examples of the release film used include a film, such as a polyester film, a polyolefin film, a polycarbonate film, a polystyrene film, an acrylic film, a triacetyl cellulose film, or a fluorene resin film, having a silicone resin coated thereon for a release treatment, and release paper.

The film may also have an additional layer, such as an antistatic layer, a hard-coating layer, and an anchoring layer, depending on necessity.

The thickness of the release film is not particularly limited, and is preferably 12 μm or more and 250 μm or less, more preferably 25 μm or more and 200 μm or less, and further preferably 38 μm or more and 188 μm or less, from the viewpoint of the processability and the handleability.

<Laminate Provided with Liquid Crystal Polarizing Membrane>

Figure 3:
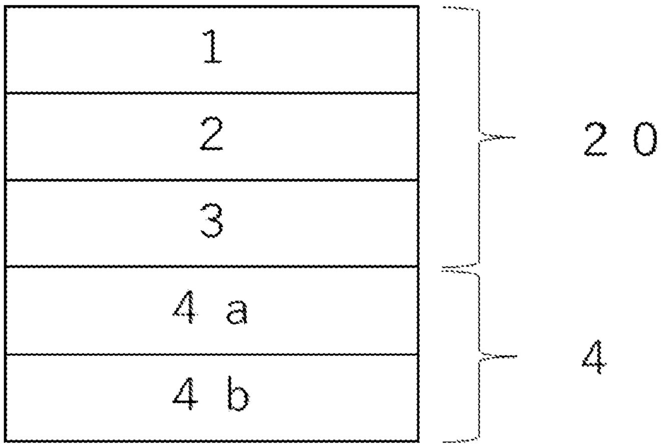
FIG. 3 is a schematic cross-sectional view showing one example of the laminate provided with a liquid crystal polarizing film of the present invention.

The laminated film and the surface protection film of the present invention can be formed into a laminate with a liquid crystal polarizing film. In the case where the present laminated film or the present surface protection film is laminated with a liquid crystal polarizing film, the members are preferably laminated with the aforementioned adhesive layer intervening between them, and may also be laminated with another known adhesive. FIG. 3 shows an example of the laminate including the surface protection film 20 of the present invention and a liquid crystal polarizing film 4.

In the present invention, a "polarizing element" means an optical component having optical anisotropy, and a "liquid crystal polarizing film" means a laminate including a membrane formed by coating an optically anisotropic composition containing a liquid crystal compound. Examples of the liquid crystal compound include a polymerizable liquid crystal compound, a polymer liquid crystal compound, and a lyotropic liquid crystal compound. For example, a cured article obtained in such a manner that an optically anisotropic composition containing a polymerizable liquid crystal compound is coated on a base material and then cured in an oriented state can be used as a polarizing element. In this case, the base material may be included or may not be included.

In the present invention, the liquid crystal polarizing film used as a polarizing element is formed by coating, and therefore is classified into a coating type polarizing element, which is different from the ordinary stretch type polarizing element.

For example, the ordinary polarizing plate generally has a structure including a polyvinyl alcohol (PVA) film held with protection films, such as TAC (triacetyl cellulose films), on which an adhesive is coated, or an adhesive sheet is laminated.

However, the use of the liquid crystal polarizing film can avoid the protection films due to the better humidity resistance than the ordinary polarizing plate, and thereby the thickness can be reduced.

The laminated film or the surface protection film of the present invention has both the ultraviolet ray absorbing function and the surface protection function, and the use thereof laminated with the liquid crystal polarizing film can reduce the thickness and the weight of the image display apparatus while suppressing light deterioration of the liquid crystal polarizing film.

The laminate provided with a liquid crystal polarizing film can be obtained, for example, by a method of forming the liquid crystal polarizing film on a base material having a releasability, and then transferring the liquid crystal polarizing film to the surface of the laminated film or the surface protection film, a method of forming the laminated film or the surface protection film directly on the liquid crystal polarizing film, or a method of forming the liquid crystal polarizing film on the laminated film or the surface protection film.

The laminate provided with a liquid crystal polarizing film of the present invention has an effect of enhancing the light resistance of the polarizing membrane with the present laminated film or the present surface protection film. Specifically, after performing a test of irradiating the laminate provided with a liquid crystal polarizing film of the present invention with light using a xenon light resistance tester (device name: Ci4000, available from Atlas Testing Solutions) under an irradiation condition of an illuminance of 0.55 $W/m^2$ (340 nm) for 40 hours, the change rate of polarization degree (i.e., (polarization degree before test)−(polarization degree after test)) at a wavelength of 595 nm can be 4.0% or less, providing excellent light resistance. The change rate of polarization degree is more preferably 3.5% or less, further preferably 3.0% or less, still further preferably 2.5% or less, and particularly preferably 2.0% or less, and can be 1.0% or less.

[Liquid Crystal Polarizing Membrane]

The liquid crystal polarizing film in the present invention is a laminate including the liquid crystal polarizing film formed by coating an optically anisotropic composition containing a polymerizable liquid crystal compound as described above. The liquid crystal polarizing film generally has an optically anisotropic layer obtained by coating an optically anisotropic composition containing a polymerizable liquid crystal compound and the like on an orientation membrane provided on a base material, and polymerizing the polymerizable liquid crystal compound in an oriented state. Accordingly, as shown in FIG. 3, the liquid crystal polarizing film may include an optically anisotropic layer 4*a* formed of an optically anisotropic composition, and an orientation membrane 4*b*. The liquid crystal polarizing film may also have only an optically anisotropic layer 4*a* without an orientation membrane 4*b*.

Examples of the base material include a resin sheet containing one or two or more of a resin selected from the group consisting of a polyolefin resin, a cyclic polyolefin resin, a polyester resin, a poly(meth)acrylate ester resin, a cellulose ester resin, a polycarbonate resin, and a polyimide resin, as a major component, and glass. The base material may have thereon an additional layer, such as an antistatic layer, a hard-coating layer, an anchoring layer, a release layer, a highly adhesive layer, a protection layer, a bleeding preventing layer, a flattening layer, depending on necessity.

Examples of the method of orienting the polymerizable liquid crystal compound include a method using the orientation regulating force of the orientation membrane provided on the base material, an orientation regulating force of an external field, such as an electric field or a magnetic field, and/or a shearing force in coating. The method using the orientation membrane is preferred from the viewpoint of the achievement of the liquid crystal polarizing film showing a good optical capability with a highly ordered oriented state of the liquid crystal compound.

The orientation membrane provided on the base material is a layer having an orientation regulating force that orients the liquid crystal compound described later to the intended direction. The orientation membrane preferably has a solvent resistance preventing dissolution in coating the optically anisotropic composition, an appropriate solvent affinity preventing the optically anisotropic composition from being repelled, and a heat resistance in a heat treatment for drying the solvent or orienting the liquid crystal.

The orientation membrane may be subjected to an orientation treatment by the known methods described in "Ekisho Binran" (Liquid Crystal Handbook), (published by Maruzen Co., Ltd., on October 30, Heisei 12 (2000)) pp. 226 to 239 (such as the rubbing method, the method of forming grooves (minute groove structure) on the surface of the orientation membrane, the method using polarized ultraviolet light or polarized laser (photo-orientation method), the orientation method by forming an LB membrane, and the orientation method by oblique deposition of an inorganic material). In particular, the rubbing method and the photo-orientation method are preferred from the viewpoint of the easiness in providing a high orientation degree.

The thickness of the orientation membrane is generally 10 nm to 1,000 nm, and preferably 50 nm to 800 nm. In the case where the range is satisfied, both the sufficient orientation regulating force sufficient for orienting the liquid crystal compound and the reduction in thickness can be achieved simultaneously.

The optically anisotropic composition may be a composition containing various additives, such as a polymerization initiator, a polymerization inhibitor depending on necessity, a polymerization aid, a polymerizable non-liquid crystal compound, a non-liquid crystal compound, a surfactant, a leveling agent, a coupling agent, a pH modifier, a dispersant, an antioxidant, an organic or inorganic filler, and a metal oxide, and a solvent, in addition to the polymerizable liquid crystal compound and the photopolymerization initiator, and a cured article layer of the present composition exerts the optical function as the polarizing element.

In the case where the polarizing element is a liquid crystal polarizing film, the present composition preferably contains a colorant. The colorant is preferably a dichroic colorant, and examples of the dichroic colorant include iodine and a dichroic organic dye. One of the dichroic colorant may be used, or plural different colorants may be used in combination.

The dichroic organic dye is not particularly limited, and examples thereof include an azo-based colorant, a quinone-based colorant (including a naphthoquinone-based colorant, an anthraquinone-based colorant, and the like), a stilbene-based colorant, a cyanine-based colorant, a phthalocyanine-based colorant, an indigo-based colorant, and a condensed polycyclic-based colorant (including a perylene-based colorant, an oxazine-based colorant, an acridine-based colorant, and the like). Among these colorants, an azo-based colorant is preferred due to the molecular large aspect ratio thereof capable of providing good dichroism.

(Polymerizable Liquid Crystal Compound)

The polymerizable liquid crystal compound is a liquid crystal compound having a polymerizable functional group, and thus has both the function as a polymerizable monomer and the function as a liquid crystal, and therefore in curing the compound in an oriented state, a cured article formed of a polymer having a fixed orientation, i.e., an optically anisotropic material, can be obtained.

Accordingly, a polarizing membrane having an optical anisotropy can be obtained in such a manner that the optically anisotropic composition containing a polymerizable liquid crystal compound is coated on a base material and cured in an oriented state. One of the polymerizable liquid crystal compound may be used, plural compounds having different structures may be used in combination.

The polymerizable liquid crystal compound used may be any of a low molecular weight liquid crystal compound having a polymerizable functional group and a polymer liquid crystal compound having a polymerizable functional group. Among these, the low molecular weight liquid crystal compound is preferred due to the tendency that a cured article having high orientation can be easily obtained with the polymerizable liquid crystal compound.

The liquid crystal phase shown by the polymerizable liquid crystal compound may be appropriately selected from a nematic liquid crystal, a smectic liquid crystal, a cholesteric liquid crystal, a discotic liquid crystal, and the like, and a nematic liquid crystal or a smectic liquid crystal is preferably shown thereby from the viewpoint of the easiness in production and the achievement of a highly ordered oriented state.

The polymerizable functional group is preferably a photopolymerizable group due to the easiness in fixing the orientation structure. Specific examples thereof include an acryloyl group, a methacryloyl group, an acryloyloxy group, a methacryloyloxy group, an acryloylamino group, a methacryloylamino group, a vinyl group, a vinyloxy group, an ethynyl group, an ethynyloxy group, a 1,3-butadienyl group, 1,3-butadienyloxy group, an oxiranyl group, an oxetanyl group, a glycidyl group, a glycidyloxy group, a styryl group, and a styryloxy group. Among these, a (meth)acryloyl group and a (meth)acryloyloxy group are preferred.

The molecular structure of the polymerizable liquid crystal compound is not particularly limited, and a liquid crystal compound having a polymerizable group can be used. Examples of the polymerizable liquid crystal compound contained in the composition for forming an anisotropic colorant film of the present invention include a compound represented by the following formula (1) (which may be hereinafter referred to as a "polymerizable liquid crystal compound (1)").

$$Q^1\text{-}R^1\text{-}A^{11}\text{-}Y^1\text{-}A^{12}\text{-}(Y^2\text{-}A^{13})_k\text{-}R^2\text{-}Q^2 \quad (1)$$

wherein in the formula (1),

- $-Q^1$ represents a hydrogen atom or a polymerizable group;
- $-Q^2$ represents a polymerizable group;
- $—R^1—$ and $—R^2—$ each independently represent a chain-like organic group;
- $-A^{11}$- and $A^{13}$- each independently represent a partial structure represented by the following formula (2), a divalent organic group, or a single bond;
- $-A^{12}$- represents a partial structure represented by the following formula (2) or a divalent organic group;
- $—Y^1—$ and $—Y^2—$ each independently represent a single bond, —C(═O)O—, —OC(═O)—, —C(═S)O—, —OC(═S)—, —C(═O)S—, —SC(═O)—, $—CH_2CH_2—$, —CH═CH—, —C(═O)NH—, —NHC(═O)—, $—CH_2O—$, $—OCH_2—$, $—CH_2S—$, or $—SCH_2—$;
- one of $-A^{11}$- and $A^{13}$- represents a partial structure represented by the following formula (2) or a divalent organic group; and
- k represents 1 or 2,
- in which in the case where k is 2, two moieties represented by $—Y^2\text{-}A^{13}$- may be the same as or different from each other.

$$\text{-Cy-}X^2—C{\equiv}C—X^1— \quad (2)$$

wherein in the formula (2),

- -Cy- represents a hydrocarbon ring group or a heterocyclic group;
- $—X^1—$ represents —C(═O)O—, —OC(═O)—, —C(═S)O—, —OC(═S)—, —C(═O)S—, —SC(═O)—, $—CH_2CH_2—$, —CH═CH—, —C(═O)NH—, —NHC(═O)—, $—CH_2O—$, $—OCH_2—$, $—CH_2S—$, or $SCH_2—$; and
- $—X^2—$ represents a single bond, —C(═O)O—, —OC(═O)—, —C(═S)O—, —OC(═S)—, —C(═O)S—, —SC(═O)—, $—CH_2CH_2—$, —CH═CH—, —C(═O)NH—, —NHC(═O)—, $—CH_2O—$, $—OCH_2—$, $—CH_2S—$, or $—SCH_2—$.

In the formula (1), the chain-like organic group represented by $—R^1—$ and $—R^2—$ is preferably $—(CH_2)_n—CH_2—$, $—O—(CH_2)_n—CH_2—$, $—(O)_{n1}—(CH_2CH_2O)_{n2}—(CH_2)_{n3}—$, or $—(O)_{n1}—(CH_2)_{n2}—(CH_2CH_2O)_{n3}—$. In the formulae, n represents an integer of 1 to 24, preferably an integer of 2 to 24, more preferably an integer of 4 to 19, and further preferably an integer of 5 to 19. In the formulae, n1, n2, and n3 each independently represent an integer, and are appropriately regulated to make a number of atoms of the main chain of the chain-like organic group (which means the longest chain-like moiety in the chain-like organic group, and in the case where the chain-like organic group is substituted with a polymerizable group, means the longest chain-like moiety in the part except for the polymerizable group) of preferably 3 to 25, more preferably 5 to 20, and further preferably 6 to 20.

In the case where $-A^{11}$- represents a partial structure represented by the formula (2), the formula (1) may be the following formula (1A) or may be the following formula (1B).

$$Q^1\text{-}R^1\text{-Cy-}X^2—C{\equiv}C—X^1—Y^1\text{-}A^{12}\text{-}(Y^2\text{-}A^{13})_k\text{-}R^2\text{-}Q^2 \quad (1A)$$

$$Q^1\text{-}R^1—X^1—C{\equiv}C—X^2\text{-Cy-}Y^1\text{-}A^{12}\text{-}(Y^2\text{-}A^{13})_k\text{-}R^2\text{-}Q^2 \quad (1B)$$

In the case where $-A^{12}-$ represents a partial structure represented by the formula (2), the formula (1) may be the following formula (1C) or may be the following formula (1D).

$$Q^1\text{-}R^1\text{-}A^{11}\text{-}Y^1\text{-}Cy\text{-}X^2\text{—}C{\equiv}C\text{—}X^1\text{—}(Y^2\text{-}A^{13})_k\text{-}R^2\text{-}Q^2 \quad (1C)$$

$$Q^1\text{-}R^1\text{-}A^{11}\text{-}Y^1\text{—}X^1\text{—}C{\equiv}C\text{—}X^2\text{-}Cy\text{-}(Y^2\text{-}A^{13})_k\text{-}R^2\text{-}Q^2 \quad (1D)$$

In the case where $-A^{13}-$ represents a partial structure represented by the formula (2), the formula (1) may be the following formula (1E) or may be the following formula (1F).

$$Q^1\text{-}R^1\text{-}A^{11}\text{-}Y^1\text{-}A^{12}\text{-}(Y^2\text{-}Cy\text{-}X^2\text{—}C{\equiv}C\text{—}X^1)_k\text{—}R^2\text{-}Q^2 \quad (1E)$$

$$Q^1\text{-}R^1\text{-}A^{11}\text{-}Y^1\text{-}A^{12}\text{-}(Y^2\text{—}X^1\text{—}C{\equiv}C\text{—}X^2\text{-}Cy)_k\text{-}R^2\text{-}Q^2 \quad (1F)$$

Similarly, in the case where two or more of $-A^{11}-$, $-A^{12}-$, and $-A^{13}-$ each represent a partial structure represented by the formula (2), the directions of the partial structures represented by the formula (2) each may independently inverted.

As described above, $-A^{11}-$, $-A^{12}-$, and $-A^{13}-$ each independently represent a partial structure represented by the formula (2) or a divalent organic group, and additionally $-A^{11}-$ and $-A^{13}-$ each may be a single bond, provided that both $-A^{11}-$ and $-A^{13}-$ are not single bonds simultaneously.

The polymerizable liquid crystal compound (1) is preferably a compound represented by the formula (1A), (1B), (1E), or (1F), due to the tendency that a high orientation can be obtained.

In the photopolymerization of the polymerizable liquid crystal compound, the optically anisotropic composition preferably contains a photopolymerization initiator. The photopolymerization initiator used may be appropriately a known one.

The thickness of the cured membrane of the optically anisotropic composition is preferably 100 nm or more, more preferably 300 nm or more, and further preferably 1 μm or more, from the viewpoint of the securement of the optical function.

The thickness of the cured membrane is preferably 50 μm or less, more preferably 10 μm or less, and further preferably 5 μm or less, from the viewpoint of the contribution to the reduction of the thickness of the image display apparatus.

The thickness of the liquid crystal polarizing film, which is the laminate including the membrane formed by coating the optically anisotropic composition, is preferably ⅕ or less of the thickness of the base film in the present laminated film or the present surface protection film, and more preferably ⅐ or less thereof. In the case where the liquid crystal polarizing film has the optically anisotropic layer and the orientation membrane, it suffices that the total thickness of the liquid crystal polarizing film and the thickness of the base film satisfy the aforementioned ratio.

On the cured membrane of the composition, an additional layer, such as an antistatic layer, a hard-coating layer, an anchoring layer, a release layer, a highly adhesive layer, a protection layer, a bleeding preventing layer, a flattening layer, may be formed depending on necessity.

<Image Display Apparatus>

The laminated film and the surface protection film of the present invention can be laminated with another optical component to form an image display apparatus. Accordingly, the image display apparatus includes the present laminated film or the present surface protection film. For example, the image display apparatus includes the laminate provided with a liquid crystal polarizing film including the present laminated film or the present surface protection film laminated with a liquid crystal polarizing film.

Specific examples of the image display apparatus include a liquid crystal display, an organic EL display, an inorganic EL display, electronic paper, a plasma display, and a micro-electromechanical system (MEMS) display.

The present laminated film and the present surface protection film are preferably used for an organic EL display.

Figure 4:
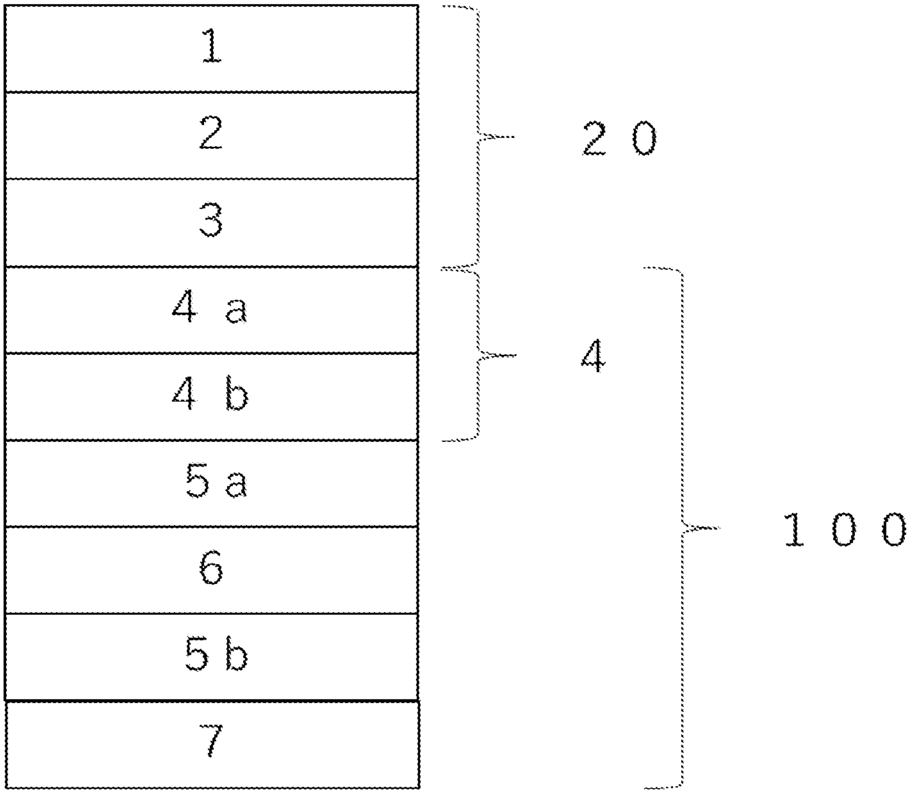
FIG. 4 is a schematic cross sectional view showing one example of the image display apparatus of the present invention.

FIG. 4 shows an example of the image display apparatus (organic EL device) according to the present invention.

FIG. 4 shows a configuration example of the image display apparatus (organic EL device) 100 having a liquid crystal polarizing film 4, a phase difference film 6, and an organic EL light emitting layer 7, in which the present surface protection film 20 is provided on the viewing side of the liquid crystal polarizing film 4.

In the configuration example shown in FIG. 4, the present surface protection film 20 functions as a cover plastic sheet (i.e., a front plate), and thereby the deterioration of the liquid crystal polarizing film 4 due to external incident light can be suppressed.

The configuration of the image display apparatus according to the present invention is not limited to FIG. 4.

For example, in the case where the present laminated film or the present surface protection film is used in the image display apparatus including a liquid crystal polarizing film, the present laminated film, the present surface protection film, and the liquid crystal polarizing film may be laminated with a known adhesive.

An additional component may be allowed to intervene between the present laminated film and the liquid crystal polarizing film, or between the present surface protection film and the liquid crystal polarizing film.

Examples of the "additional component" include a reflection sheet, a light guide plate and a light source, a diffusion film, a prism sheet, a glass substrate, an electrode, a touch sensor, and a composite component including these components integrated.

In addition to the aforementioned components, further additional layers, such as an antistatic layer, a hard-coating layer, an anchoring layer, a highly adhesive layer, a protection layer, a bleeding preventing layer, and a flattening layer, may be allowed to intervene.

<Explanation of Words>

In the present invention, the case referring to "film" includes "sheet", and the case referring to "sheet" includes "film".

In the present invention, the description "X to Y" (wherein X and Y each represent an arbitrary numeral) encompasses not only the meaning "X or more and Y or less", but also the meanings "preferably more than X" and "preferably less than Y" unless otherwise indicated.

Furthermore, the description "X or more" (wherein X represents an arbitrary numeral) encompasses the meaning "preferably more than X" unless otherwise indicated, and the description "Y or less" (wherein Y represents an arbitrary numeral) encompasses the meaning "preferably less than Y" unless otherwise indicated.

EXAMPLES

The present invention will be described in more detail with reference to examples below. However, the present invention is not limited to the examples described below.

<Materials of Layers>

The materials of the layers constituting the laminated films of Example 1 and Comparative Example 1 and surface protection films of Example 2 and Comparative Example 2 were as follows.

(1) Base Film

[Polyester Raw Materials]

Polyester A 100 parts by mass of dimethyl terephthalate and 60 parts by mass of ethylene glycol were used as starting materials. The reaction was performed with 0.09 parts by mass of magnesium acetate tetrahydrate as a catalyst at a reaction starting temperature of 150° C., and the reaction temperature was gradually increased while distilling of methanol, and then allowed to reach 230° C. after 3 hours. After 4 hours, the ester exchange reaction was substantially completed. To the reaction mixture, 0.04 parts by mass of ethyl acid phosphate and 0.04 parts by mass of antimony trioxide were added, and the polycondensation reaction was performed for 4 hours and 30 minutes. During the polycondensation reaction, the temperature was gradually increased from 230° C. to 280° C., whereas the pressure was gradually decreased from ordinary pressure to finally 0.3 mmHg. After 4 hours and 30 minutes from the start of the polycondensation reaction, the reaction was terminated, and the polymer was discharged under pressurization with nitrogen. The resulting polyester A had an intrinsic viscosity of 0.64 dL/g, and contained 98% by mass of the ester units of ethylene terephthalate and the balance of a condensed unit of diethylene glycol and terephthalic acid.

Polyester B

The polyester A was preliminarily crystallized at 160° C., and then subjected to solid phase polymerization under a nitrogen atmosphere at a temperature of 220° C., so as to provide a polyester B having an intrinsic viscosity of 0.82 dL/g, and containing 98% by mass of the ester units of ethylene terephthalate and the balance of a condensed unit of diethylene glycol and terephthalic acid.

Polyester C

The same procedure as in the polyester A was performed except that amorphous silica having an average particle diameter of 3 μm in the form of an ethylene glycol slurry was added after completing the ester exchange reaction, so as to provide a polyester C having an intrinsic viscosity of 0.64 dL/g, and containing 98% by mass of the ester units of ethylene terephthalate and the balance of a condensed ester unit of diethylene glycol and terephthalic acid. The content of the silica was 0.3 parts by mass.

Polyester D (Polyester as Ultraviolet Ray Absorbent Master Batch)

The polyester A was fed to a twin screw extruder equipped with a vent, to which 2,2'-(1,4-phenylene)bis[4H-3,1-benzoxazin-4-one] (Cyasorb UV-3638, available from Cytec Industries, Inc., molecular weight: 369, benzoxazine-based) as an ultraviolet ray absorbent to make a concentration thereof of 10% by mass, and the mixture was melt-kneaded and pelletized to provide a polyester D as an ultraviolet ray absorbent master batch. The intrinsic viscosity of the resulting polyester D was 0.61 dL/g.

Polyester E (Polyester as Ultraviolet Ray Absorbent Master Batch)

The polyester A was fed to a twin screw extruder equipped with a vent, to which the triazine 1 and the benzotriazole 2 as ultraviolet ray absorbents to make concentrations thereof of 16% by mass and 5% by mass, respectively, and the mixture was melt-kneaded and pelletized to provide a polyester E as an ultraviolet ray absorbent master batch. The intrinsic viscosity of the resulting polyester E was 0.57 dL/g.

1

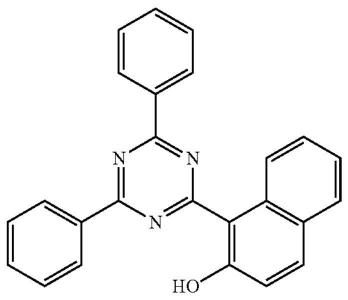

2

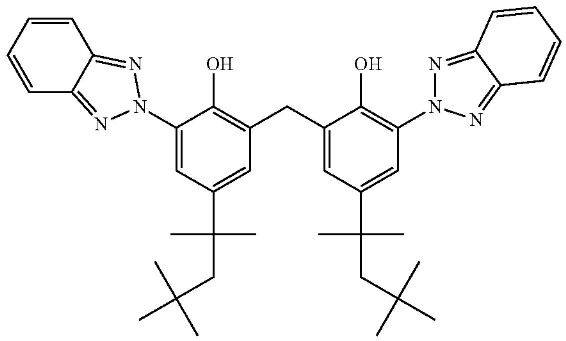

Polyester F (Polyester as Ultraviolet Ray Absorbent Master Batch)

The polyester A was fed to a twin screw extruder equipped with a vent, to which the triazine 3 and the benzotriazole 2 as ultraviolet ray absorbents to make concentrations thereof of 16% by mass and 5% by mass, respectively, and the mixture was melt-kneaded and pelletized to provide a polyester F as an ultraviolet ray absorbent master batch. The intrinsic viscosity of the resulting polyester F was 0.57 dL/g.

3

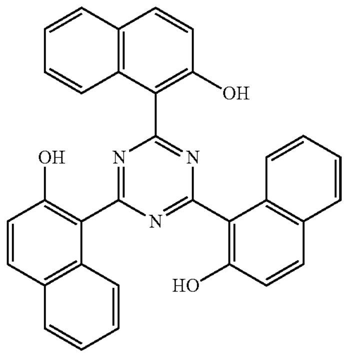

Polyester G (Polyester as Ultraviolet Ray Absorbent Master Batch)

A copolymer polybutylene terephthalate (UVAPBT, available from Daiwa Fine Chemicals Co., Ltd.) containing a benzotriazole group containing 30% by mass or a unit derived from 2,2'-methylenebis[6-(2H-benzotriazol-2-yl)-4-(2-hydroxyethyl)phenol] (DAINSORB T-33, available from Daiwa Fine Chemicals Co., Ltd.) was used.

The intrinsic viscosity of the resulting polyester G was 0.68 dL/g.

The intrinsic viscosity of the polyesters A to G was measured in the following manner. In the case where particles were contained, the particles were removed. 1 g of the polyester was precisely weighed and dissolved in 100 mL of a mixed solvent of phenol/tetrachloroethane=50/50 (mass ratio), and measured at 30° C.

The average particle diameter of the amorphous silica contained in the polyester C was measured in such a manner that the powder was observed with a scanning electron microscope (SU8220, available from Hitachi, Ltd.), the sizes of the individual particles were measured from the resulting image data, and the average value of 10 points was obtained. In this case, for non-spherical particles, the average value of the longest diameter and the shortest diameter was used as the diameter of the particle for the measurement.

(2) Cured Resin Layer

[Curable Resin Composition (α-1)]

10 parts by mass of a urethane (meth)acrylate-based compound (HA-1), 90 parts by mass of a urethane (meth) acrylate-based compound (HB-1), 5 parts by mass of Omnirad 127, available from IGM Resins B.V., as a photoinitiator (HD), and 100 parts by mass of methyl ethyl ketone (MEK) as a diluent solvent (HC) were uniformly mixed to provide an active energy radiation-curable resin composition (α-1).

(Meth)Acrylate (HA): Urethane (Meth)Acrylate-Based Compound (HA-1)

In a four-necked flask equipped with a thermometer, an agitator, a water-cooled condenser, and a nitrogen gas blowing inlet, 37.5 g (0.17 mol) of isophorone diisocyanate, 25.5 g (0.04 mol) of polytetramethylene glycol diol (hydroxy value: 167 mgKOH/g, molecular weight calculated from hydroxy value: 672), 13.4 g (0.02 mol) of polyester triol (hydroxy value: 262 mgKOH/g, molecular weight calculated from hydroxy value: 642), and 0.02 g of dibutyltin dilaurate as a reaction catalyst were charged and reacted at 80° C. At the time when the residual isocyanate group became 11%, 23.6 g (0.2 mol) of 2-hydroxyethyl acrylate and 0.04 g of methoxyphenol as a polymerization inhibitor were further charged and reacted at 60° C., and at the time when the residual isocyanate group became 0.3% or less, the reaction was completed to provide a urethane (meth)acrylate-based compound (HA-1) (ethylenic unsaturated group concentration: 2.0 mmol/g, mass average molecular weight: 3,400).

Modifier (HB): Urethane (Meth)Acrylate-Based Compound (HB-1)

In a four-necked flask equipped with a thermometer, an agitator, a water-cooled condenser, and a nitrogen gas blowing inlet, 29.3 g (0.05 mol) of a trimer of hexamethylene diisocyanate having an isocyanurate skeleton (isocyanate group content: 21.0%), 70.7 g (0.15 mol) of a mixture of pentaerythritol triacrylate and pentaerythritol tetraacrylate (hydroxy value: 120 mgKOH/g), 0.06 g of 2,6-di-tert-butyltin laurate as a polymerization inhibitor, and 0.02 g of dibutyl tin laurate as a reaction catalyst were charged and reacted at 60° C., and at the time when the residual isocyanate group became 0.3% or less, the reaction was completed to provide a mixture of 70 g of a urethane (meth)acrylate-based compound (HB-1) (ethylenic unsaturated group concentration: 6.0 mmol/g, mass average molecular weight: 10,500) and 30 g of pentaerythritol tetraacrylate.

Solvent (HC): Methyl Ethyl Ketone (MEK)

Photoinitiator (HD): Omnirad 127, available from IGM Resins B.V.

(3) Highly Adhesive Layer

[Highly Adhesive Layer Composition]

The following compounds were mixed at a ratio X1/X2/Y1/Y2/Y3=60/10/10/10/10 (% by mass in terms solid content) to provide a highly adhesive layer composition.

Binder Resin (X1): Water dispersion of polyester resin having condensed polycyclic structure obtained through polymerization of following composition Monomer composition: (acid component) 2,6-naphthalenedicarboxylic acid/5-sodium sulfo isophthalate//(diol component) ethylene glycol/diethylene glycol=92/8//80/20 (% by mol)

(X2): Water dispersion of acrylic resin obtained through polymerization of following composition Emulsion polymer (emulsifier: anionic surfactant) of ethyl acrylate/n-butyl acrylate/methyl methacrylate/N-methylolacrylamide/acrylic acid=65/21/10/2/2 (% by mass)

Crosslinking Agent (Y1): Hexamethoxymethylolated melamine (Y2): Water soluble polyglycerol polyglycidyl ether (Y3): Oxazoline group-containing acrylic polymer (Epocros (registered trade name), available from Nippon Shokubai Co., Ltd., oxazoline group amount: 4.5 mmol/g)

(4) Adhesion Layer

[Adhesive Composition]

(Meth)acrylic-based Polymer (A-1): The polymer was obtained through copolymerization of 2-ethylhexyl acrylate: 67% by mass, methyl acrylate: 5% by mass, ethyl acrylate: 10% by mass, 2-hydroxyethyl acrylate: 14% by mass, and 4-hydroxybutyl acrylate: 4% by mass. The mass average molecular weight (Mw) of the (meth)acrylate ester copolymer (A-1) measured by GPC was 700,000.

Curable Compound (B-1): Propylene glycol skeleton-containing monofunctional acrylate, PEM-X264 (available from AGC, Inc.), mass average molecular weight (Mw): ca. 10,000, glass transition temperature: −53° C.

Radical Initiator (C-1): 4-Methylbenzophenone

Solvent: Ethyl Acetate

Silane Coupling Agent: 3-Glycidoxypropylmethyldiethoxysilane (KBM403, available from Shin-Etsu Silicone, Co., Ltd.)

Rust Inhibitor: 1,2,3-Triazole

<Liquid Crystal Polarizing Membrane>

The liquid crystal polarizing film to be laminated with the surface protection film in Example 5 and Comparative Example 2 was produced from an optically anisotropic composition containing a polymerizable liquid crystal compound prepared in the following manner.

[Preparation of Polymerizable Liquid Crystal Compound]

Liquid Crystal Compound (I-1): The compound was synthesized according to the description of JP 2020-042305 A. The chemical structure of the liquid crystal compound (I-1) is shown by the following chemical formula.

I-1

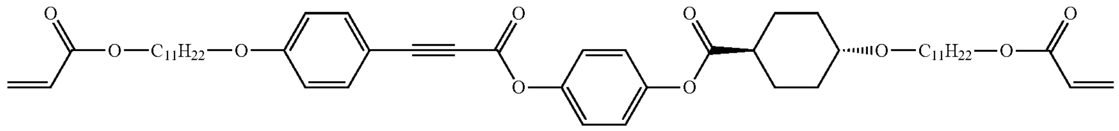

Colorant (II-1): The colorant was synthesized according to the following synthesis method.

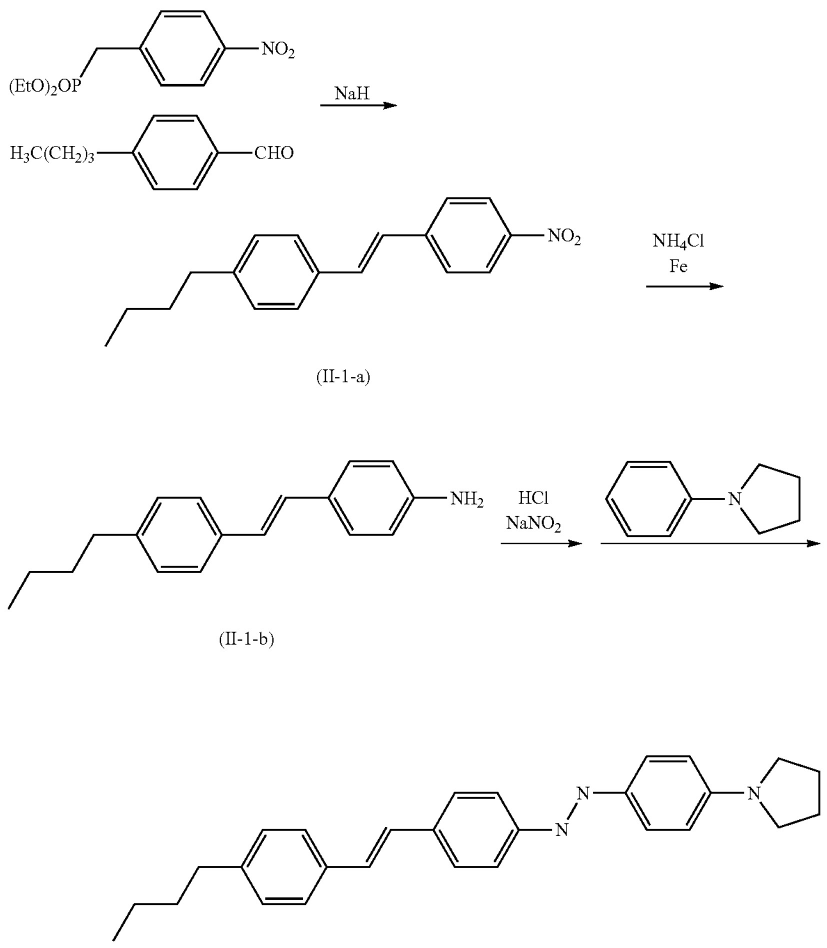

(II-1-a)

(II-1-b)

(II-1)

Synthesis of (II-1-a)

Tetrahydrofuran (100 mL) and sodium hydride (purity: 60%, 6.7 g, 168.0 mmol) were charged in an ice-cooled reactor, to which a mixture of diethyl (4-nitrobenzyl)phosphonate (18.0 g, 65.9 mmol), 4-butylbenzaldehyde (9.1 g, 56.1 mmol), and tetrahydrofuran (50 mL) was added in a dropwise manner over 10 minutes, and washed therein with tetrahydrofuran (30 mL), and then the reaction liquid was agitated at 50° C. for 0.5 hour. The reaction liquid was poured into water, extracted with ethyl acetate, and rinsed with water and a saturated sodium chloride aqueous solution, and the solvent was distilled off. The resulting crude product was dissolved in ethyl acetate (20 mL) under heating, and then after adding hexane (50 mL) thereto, cooled to form a precipitate deposited, which was filtered, rinsed with hexane, and then dried under reduced pressure to provide 15.0 g of (II-1-a).

Synthesis of (II-1-b)

(II-1-a) (15.0 g, 53.3 mmol), tetrahydrofuran (150 mL), and iron powder (13.9 g, 248.9 mmol) were mixed, to which ammonium chloride (13.3 g, 248.6 mmol) dissolved in water (30 mL) was added in a dropwise manner, and the reaction liquid was agitated at 50° C. for 3 hours. The reaction liquid was filtered with celite, extracted with ethyl acetate, and rinsed with water and a saturated sodium chloride aqueous solution, and the solvent was distilled off. The resulting crude product was suspended in hexane, and the precipitate was filtered, rinsed with hexane, and then dried to provide 10.9 g of (II-1-b).

Synthesis of (II-1)

(II-1-b) (2.51 g, 10.0 mmol), N-methylpyrrolidone (40 mL), concentrated hydrochloric acid (2.2 mL), and water (20 mL) were mixed, and after cooling to 3° C., sodium nitrite (789 mg, 11.4 mmol) was added thereto, followed by agitating at 15° C. for 3.5 hours.

1-phenylpyrrolidine (1.47 g, 10.0 mmol), methanol (60 mL), and water (30 mL) were mixed, and the pH was regulated to 3.5 with concentrated hydrochloric acid. While retaining the pH to 3 to 5 by adding a sodium hydroxide aqueous solution, the aforementioned liquid containing a diazonium salt was added thereto in a dropwise manner, followed by agitating at 15° C. for 3 hours.

The resulting precipitate was filtered, rinsed with water, and dried under reduced pressure. The resulting crude product was purified by silica gel column chromatography (hexane/methylene chloride) to provide 3.06 g of a red solid matter (II-2).

Colorant (II-2): The colorant was synthesized according to the following synthesis method.

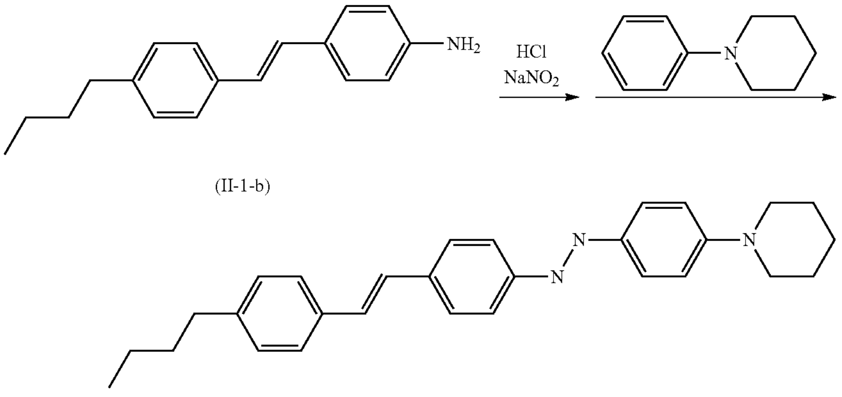

(II-1-b)

(II-2)

Synthesis of (II-2)

(II-1-b) (1.0 g, 4.0 mmol) and N-methylpyrrolidone (13 mL) were mixed, to which concentrated hydrochloric acid (1.0 g, 10.0 mmol) was added, and after cooling over an ice bath, sodium nitrite (0.3 g, 4.4 mmol) dissolved in water (1.3 mL) was added, followed by agitating for 1 hour. The reaction liquid was subjected to coupling at pH of 7 with 1-phenylpiperidine (0.6 g, 4.0 mmol) dissolved in methanol (25 mL) and water (6.5 mL), and then the deposit was filtered, rinsed with water, and dried under reduced pressure. The resulting crude product was purified by silica gel column chromatography (hexane/methylene chloride) to provide 760 mg of an orange-colored solid matter (II-2).

The chemical structures of the liquid crystal compound (I-1) and the colorants (II-1) and (II-2) are shown below. In the formulae, $C_{11}H_{22}$ means that 11 methylene units are bonded in a chain-like manner.

-continued

II-4

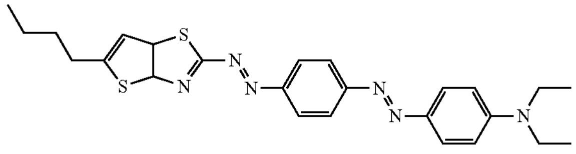

[Preparation of Optically Anisotropic Composition]

28.57 parts by mass of the liquid crystal compound (I-1), 0.10 part by mass of the colorant (II-1), 0.43 parts by mass of the colorant (II-2), 0.39 parts by mass of the colorant

I-1

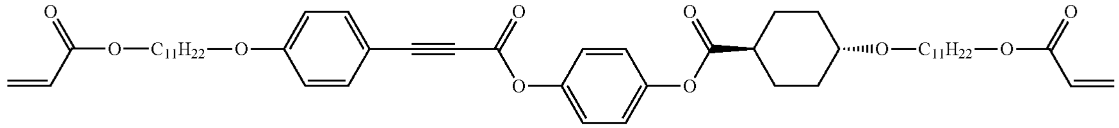

II-1

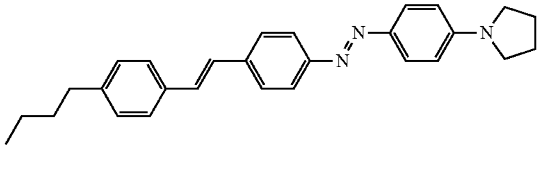

II-2

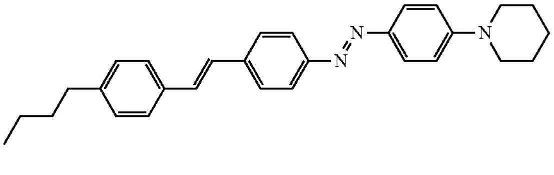

The chemical structures of the colorant (II-3) (available from Hayashibara Co., Ltd.) and the colorant (II-4) (available from Showa Kako Corporation) are shown below.

II-3

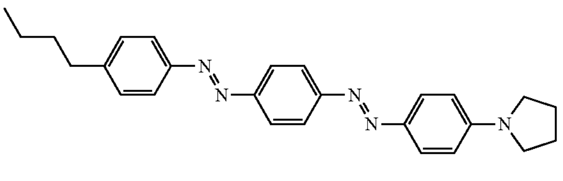

(II-3) (available from Hayashibara Co., Ltd.), 0.90 parts by mass of the colorant (II-4) (available from Showa Kako Corporation), 0.23 parts by mass of an initiator (PI-1) shown by the following chemical formula, and 0.34 parts by mass of BYK-361N (available from BYK-Chemie GmbH) were added to 69.31 parts by mass of cyclopentanone, and the mixture was agitated under heating to 80° C., and then filtered with a syringe equipped with a syringe filter (PTFE 13045, aperture: 0.45 μm, available from Membrane Solutions LLC), so as to provide an optically anisotropic composition.

(PI-1)

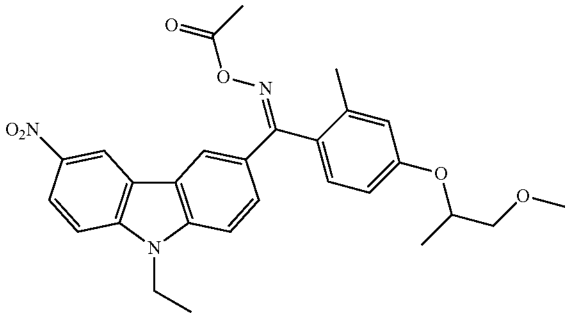

[Production of Liquid Crystal Polarizing Membrane]

The optically anisotropic composition obtained above was coated as a film by the spin coating method on a substrate including glass having formed thereon a polyimide orientation membrane (LX1400, available from Hitachi Chemical DuPont Microsystems, Ltd., orientation membrane formed by rubbing method), dried under heating to 120° C. for 2 minutes, then cooled to a liquid crystal phase, and polymerized at an exposure amount of 500 mJ/cm$^2$ (based on 365 nm), so as to provide a liquid crystal polarizing film.

An overcoat layer was provided on the liquid crystal polarizing film with a composition for an overcoat layer. The resin (R-1) contained in the composition for an overcoat layer was synthesized in the following manner.

Synthesis of (R-1)

In a flask equipped with a thermometer, an agitator, and a reflux condenser, propylene glycol monomethyl ether (157 parts by mass), glycidyl methacrylate (98 parts by mass), methyl methacrylate (1.0 part by mass), ethyl acrylate (1.0 part by mass), 2,2'-azobis(2,4-dimethylvaleronitrile) (1.0 part by mass), and 1.9 parts by mass of 3-mercaptopropyltrimethoxysilane (KBM-803, available from Shin-Etsu Silicone, Co., Ltd.) were added and reacted at 65° C. for 3 hours.

Thereafter, 2,2'-azobis(2,4-dimethylvaleronitrile) (0.5 parts by mass) was further added and reacted for 3 hours, and then propylene glycol monomethyl ether (138 parts by mass) and p-methoxyphenol (0.45 part by mass) were added and heated to 100° C.

Subsequently, acrylic acid (51 parts by mass) and triphenylphosphine (3.1 parts by mass) were added and reacted at 110° C. for 6 hours to provide a (meth)acryloyl copolymer (R-1) having a carbon-carbon double bond amount (an acryloyl equivalent (introduction amount of acryloyl group)) of 4.6 mmol/g. The mass average molecular weight (Mw) thereof was 17,700.

23.08 parts by mass of a 65% propylene glycol monomethyl ether solution of the curable resin (R-1), 0.13 part by mass of a photopolymerization initiator (PI-2) shown by the following chemical formula, 0.40 parts by mass of BYK-3550 (available from BYK-Chemie GmbH), and 76.39 parts by mass of ethanol were mixed and agitated to provide a composition for an overcoat layer. The composition for an overcoat layer was coated as a film by the spin coating method on the liquid crystal polarizing film, dried at 50° C. for 2 minutes, and then polymerized at an exposure amount of 500 mJ/cm$^2$ (based on 365 nm). Thereafter, the film was heated to 80° C. for 5 minutes to provide the liquid crystal polarizing film having the overcoat layer laminated thereon.

The resulting liquid crystal polarizing film having the overcoat layer laminated thereon was held and rotated on a commercially available polarizing plate, and thereby dark-light change occurred, from which the liquid crystal polarizing film had a favorable capability usable as a polarizing membrane.

(PI-2)

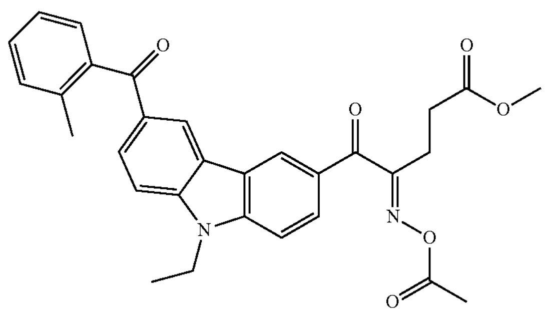

Example 1: Laminated Film

A laminated film of Example 1 including ultraviolet ray absorbent-containing polyester film/highly adhesive layer/cured resin layer was obtained in the following manner.

(Production of Ultraviolet Ray Absorbent-Containing Polyester Film)

A mixed raw material obtained by blending the polyester A and the polyester D at a mass ratio of 90/10 was used as a material of an intermediate layer, and a mixed raw material obtained by blending the polyester B and the polyester C at a mass ratio of 86/14 was used as a material of a surface layer. The mixed raw materials were melted with separate twin screw extruders and co-extruded from a T-die at a discharge amount ratio of 1/23/1. The molten sheet was quenched on a cast drum to a temperature lower than the glass transition temperature, so as to provide a three-layer unstretched film. Subsequently, the film was stretched in the longitudinal direction 3.4 times at 83° C. with a roll stretching machine. The composition for a highly adhesive layer described above was coated on one surface of the film, and then the film was stretched in the transverse direction 4 times at 125° C. with a tenter stretching machine, thermally fixed at 234° C., and then quenched to a temperature lower than the glass transition temperature, so as to provide a film having a thickness of 75 μm having a highly adhesive layer having a thickness (after drying) of 0.1 μm.

(Formation of Cured Resin Layer)

The curable resin composition was coated on the highly adhesive layer with a bar coater to a thickness (after curing) of 3 μm, and after drying at 80° C. for 60 seconds, subjected to ultraviolet ray irradiation (cumulative light amount: 400 mJ/cm$^2$), so as to form a cured resin layer.

Example 2: Laminated Film

A laminated film of Example 2 including ultraviolet ray absorbent-containing polyester film/highly adhesive layer/cured resin layer was obtained in the following manner.

(Production of Ultraviolet Ray Absorbent-Containing Polyester Film)

A mixed raw material obtained by blending the polyester A and the polyester E at a mass ratio of 93/7 was used as a material of an intermediate layer, and a mixed raw material obtained by blending the polyester B and the polyester C at a mass ratio of 86/14 was used as a material of a surface layer. The mixed raw materials were melted with separate twin screw extruders and co-extruded from a T-die at a discharge amount ratio of 2.5/45/2.5. The molten sheet was quenched on a cast drum to a temperature lower than the glass transition temperature, so as to provide a three-layer unstretched film. Subsequently, the film was stretched in the longitudinal direction 3.3 times at 86° C. with a roll stretching machine. The composition for a highly adhesive layer described above was coated on one surface of the film, and then the film was stretched in the transverse direction 3.6 times at 110° C. with a tenter stretching machine, thermally fixed at 200° C., and then quenched to a temperature lower than the glass transition temperature, so as to provide a film having a thickness of 50 μm having a highly adhesive layer having a thickness (after drying) of 0.1 μm.

(Formation of Cured Resin Layer)

The curable resin composition was coated on the highly adhesive layer with a bar coater to a thickness (after curing) of 3 μm, and after drying at 80° C. for 60 seconds, subjected to ultraviolet ray irradiation (cumulative light amount: 400 mJ/cm$^2$), so as to form a cured resin layer.

Example 3: Laminated Film

A laminated film including ultraviolet ray absorbent-containing polyester film/highly adhesive layer/cured resin layer was obtained by performing the same production as in Example 2 except that a mixed raw material obtained by blending the polyester A and the polyester F at a mass ratio of 90/10 was used as a material of an intermediate layer.

Example 4: Laminated Film

A laminated film including ultraviolet ray absorbent-containing polyester film/highly adhesive layer/cured resin layer was obtained by performing the same production as in Example 2 except that a mixed raw material obtained by blending the polyester A and the polyester G at a mass ratio of 85/15 was used as a material of an intermediate layer.

Example 5: Surface Protection Film

A surface protection film of Example 5 including the laminated film of Example 1 having an adhesive layer on one surface thereof was obtained by using an adhesive sheet obtained in the following manner.

(Production of Adhesive Sheet)

200 parts by mass of a solution of the (meth)acrylic-based polymer (A-1) (diluent solvent: ethyl acetate, solid concentration: 50% by mass), 25 parts by mass of the curable compound (B-1), 3 parts by mass of the radical initiator (C-1), 0.3 parts by mass of 3-glycidoxypropyltrimethoxysilane (KBM-403, available from Shin-Etsu Silicone, Co., Ltd.) as a silane coupling agent, 0.3 parts by mass of 1,2,3-triazole as a rust inhibitor, and 101 parts by mass of ethyl acetate were uniformly mixed to produce an adhesive composition.

The adhesive composition was extended to a sheet form having a thickness of 50 μm after drying the solvent on a release film having a thickness of 100 μm having been subjected to a silicone release treatment (Diafoil MRV, available from Mitsubishi Chemical Corporation).

Subsequently, the adhesive composition in a sheet form was placed in a dryer heated to 95° C. along with the release film, and retained for 10 minutes to evaporate the solvent in the adhesive composition.

A release film having a thickness of 75 μm having been subjected to a silicone release treatment (Diafoil MRQ, available from Mitsubishi Chemical Corporation) was laminated on the resin composition in a sheet form, from which the solvent had been evaporated, so as to form a laminate, and the adhesive composition was irradiated through the release film with light to make a cumulative light amount at a wavelength of 365 nm of 1,000 mJ/cm$^2$ with a metal halide irradiation equipment (UVC-051651, available from Ushio, Inc., lamp: UVL-8001M3-N), so as to provide an adhesive sheet provided with release films including the release films laminated on both sides thereof (thickness of adhesive sheet: 50 μm). The resulting adhesive sheet had an adhesion force of 10 N/cm and a glass transition temperature (Tg) of −38° C.

The adhesion force of the adhesive sheet was measured in the following manner.

One of the release films was released off, and a polyethylene terephthalate film (Cosmoshine A4300, a trade name, available from Toyobo, Co., Ltd., thickness: 100 μm) as a backing film was adhered under pressure with a hand roller. The assembly was cut into a strip form having a width of 10 mm and a length of 100 mm, and the adhesive surface exposed by releasing the remaining release film was adhered to soda-lime glass with a hand roller. The adhesion operation was completed by subjecting the assembly to an autoclave treatment (60° C., gauge pressure: 0.2 MPa, 20 minutes), so as to produce a specimen for measuring the adhesion force.

The adhesive sheet was peeled off from the glass by pulling the backing film at an angle of 180° and a peeling speed of 300 ram/min with a universal tester (Model 5965, a device name, available from Instron Japan Co., Ltd.), and the tensile strength was measured with a load cell to measure the 180° peel strength (N/cm) of the adhesive sheet to the glass.

The glass transition temperature (Tg) of the adhesive sheet was measured in the following manner.

The release films were removed from the adhesive sheet provided with release films, and the adhesive sheets were laminated to provide a laminate having a thickness of 1.0 mm. A column having a diameter of 8 mm (height: 1.0 mm) was punched out from the resulting laminate of the adhesive layers and designated as a specimen for measurement.

The specimen was measured for the loss tangent (tan δ) under the following condition with a viscoelastic measurement equipment (DHR 1, a device name, available from T.A. Instruments Japan, Inc.).

The temperature at which the maximum point of the loss tangent (tan δ) appeared on the resulting data was designated as the glass transition temperature (Tg).

(Production of Surface Protection Film Provided with Release Film)

One of the release films was released off, and the film surface of the laminated film obtained in Example 1 without cured resin layer provided and the adhesive sheet were adhered to provide a surface protection film provided with a release film.

(Production of Laminate Provided with Liquid Crystal Polarizing Membrane)

The release film was released off from the surface protection film provided with a release film, and the exposed surface of the adhesive layer was adhered to the surface of the overcoat layer of the liquid crystal polarizing film, so as to produce a laminate provided with a liquid crystal polarizing film as an evaluation specimen.

Comparative Example 1: Lamination Film

A laminated film of Comparative Example 1 including polyester film containing no ultraviolet ray absorbent/highly adhesive layer/cured resin layer was obtained in the following manner.

(Production of Polyester Film Containing No Ultraviolet Ray Absorbent)

The polyester A was used as a material of an intermediate layer, and a mixed raw material obtained by blending the polyester B and the polyester C at a mass ratio of 86/14 was used as a material of a surface layer. The raw materials were melted with separate twin screw extruders and co-extruded from a T-die at a discharge amount ratio of 1/23/1. The molten sheet was quenched on a cast drum to a temperature lower than the glass transition temperature, so as to provide a three-layer unstretched film. Subsequently, the film was stretched in the longitudinal direction 3.4 times at 83° C. with a roll stretching machine. The composition for a highly adhesive layer described above was coated on one surface of the film, and then the film was stretched in the transverse direction 4 times at 125° C. with a tenter stretching machine, thermally fixed at 234° C., and then quenched to a temperature lower than the glass transition temperature, so as to provide a film having a thickness of 75 μm having a highly adhesive layer having a thickness (after drying) of 0.1 μm.

A cured resin layer was formed on the resulting film in the same manner as in Example 1, so as to provide a laminated film of Comparative Example 1.

Comparative Example 2: Surface Protection Film

A surface protection film provided with an adhesive layer on one surface thereof of Comparative Example 2 was obtained in the same manner as in Example 5 except that the laminated film of Comparative Example 1 was used.

A laminate provided with a liquid crystal polarizing film was produced as an evaluation specimen.

Reference Example: Laminated Film

A laminated film of Example 1 including ultraviolet ray absorbent-containing polyester film/highly adhesive layer/cured resin layer was obtained in the following manner.

A composition for a hard-coating layer 1 was coated on the laminated film with a bar coater to form a coating film. Thereafter, the coating film thus formed was heated to 90° C. for 1 hour to evaporate the solvent of the coating film, and irradiated with an ultraviolet ray to make an ultraviolet ray irradiation amount of 100 $mJ/cm^2$ in terms of cumulative light amount, so as to half-cure the coating film. Subsequently, a composition for a hard-coating layer 2 was coated on the surface of the half-cured coating film of the composition for a hard-coating layer 1 with a bar coater to form a coating film. The coating film thus formed was heated to 90° C. for 1 hour to evaporate the solvent of the coating film, and irradiated with an ultraviolet ray to make an ultraviolet ray irradiation amount of 200 $mJ/cm^2$ in terms of cumulative light amount, so as to full-cure the coating film.

According to the procedure, a hard-coating layer including a first hard-coating layer having a thickness of 10 μm and a second hard-coating layer having a thickness of 5 μm laminated on the first hard-coating layer was formed on the polyester film base material.

(Composition for Hard-Coating Layer 1)

- Mixture of dipentaerythritol pentaacrylate and dipentaerythritol hexaacrylate (M-405, a product name, available from Toagosei Co., Ltd.): 25 parts by mass
- Dipentaerythritol EO-modified hexaacrylate (A-DPH-6E, a product name, available from Shin-Nakamura Chemical Co., Ltd.): 25 parts by mass
- Silica fine particles (MEK-AC-2140Z, available from Nissan Chemical Industries, Ltd., average particle diameter: 15 nm): 50 parts by mass (in terms of solid content)
- Photopolymerization initiator (1-hydroxycyclohexyl phenyl ketone, Irgacure (registered trade name) 184, a product name, available from BASF Japan, Ltd.): 4 parts by mass
- Fluorine-based leveling agent (DAC-HP, a product name, available from Daikin Industries, Ltd.): 1 part by mass (in terms of solid content)
- Methyl ethyl ketone (MEK): 158 parts by mass (Composition for Hard-Coating Layer 2)

- Urethane acrylate (UV1700B, a product name, available from Mitsubishi Chemical Corporation): 25 parts by mass
- Antifouling agent (BYK-UV3570, a product name, available from BYK-Chemie Japan K.K.): 1.5 parts by mass (in terms of solid content)
- Photopolymerization initiator (1-hydroxycyclohexyl phenyl ketone, Irgacure (registered trade name) 184, a product name, available from BASF Japan, Ltd.): 4 parts by mass
- Methyl ethyl ketone (MEK): 233 parts by mass <Evaluation of Laminated Film>

The laminated films of Example 1 and Comparative Example 1 were evaluated for the surface hardness, the flex resistance, and the ultraviolet ray absorbing capability.

(1) Surface Hardness

The pencil hardness of the surface of the cured resin layer of each of the laminated films was measured according to JIS K5600-5-4:1999 under a load condition of 750 g with a pencil hardness tester (available from Yasuda Seiki Seisakusho, Ltd.).

(2) Flex Resistance

The laminated films each were subjected to a 200,000 times bending test at R=2 mm with the side of the cured resin layer thereof directed toward the outer surface with a bending tester (DLDMLH-FS, available from Yuasa Co., Ltd.), and the occurrence of cracks in the cured resin layer on the outer surface was visually confirmed. A case without cracks occurring was evaluated as A (good), and a case with crack occurring was evaluated as B (bad).

(3) Ultraviolet Ray Absorbing Capability

The laminated films each were measured for the light transmittances in a wavelength range of 300 to 430 nm with a spectral photometer (U-3900H, a device name, available from Hitachi High-Tech Corporation), and an average value was obtained.

(4) Light Transmittances at Wavelengths

The laminated films each were measured for the light transmittances at various wavelengths with a spectral photometer (U-3900H, a device name, available from Hitachi High-Tech Corporation).

(5) Measurement Method of b-Value

The laminated films each were measured for the b-value of the single ply of the film according to JIS Z8722:2009 by the transmission method with a spectral colorimeter, CM-3700d, available from Konica Minolta, Inc.

<Evaluation of Surface Protection Film>

The surface protection films of Example 5 and Comparative Example 2 were evaluated for the protection capability of a liquid crystal polarizing film.

[Protection Capability of Liquid Crystal Polarizing Membrane]

The surface protection films provided with a release film (cured resin layer/highly adhesive layer/ultraviolet ray absorbent-containing polyester film/adhesive layer/release film) obtained in Example 5 and Comparative Example 2, from which the release film was released off, each were adhered to the liquid crystal polarizing film under pressure with a hand roller. The adhesion operation was completed by subjecting the assembly to an autoclave treatment (60° C., gauge pressure: 0.2 MPa, 20 minutes), so as to produce a specimen for measuring the protection capability of a liquid crystal polarizing film.

The specimen was subjected to a test with a xenon light resistance tester (device name: Ci4000, available from Atlas Testing Solutions) under an irradiation condition of an illuminance of 0.55 W/m$^2$ (340 nm) for 40 hours. As a result of the light resistance test, the values of the change rate of polarization degree (%) (i.e., (polarization degree before test)−(polarization degree after test)) at a wavelength of 595 nm are shown in Table 2.

The polarization degree Pe was obtained in such manner that with measuring light having linear polarization incident on the anisotropic colorant film, the transmittance of the polarized light in the absorption axis direction of the anisotropic colorant film and the transmittance of the polarized light in the polarizing axis direction of the anisotropic colorant film were measured with a spectral photometer equipped with a Glan-Thompson polarizer (RETS-100, a product name, available from Otsuka Electronics Co., Ltd.), and the polarization degree was calculated according to the following expression.

$$Pe=(Ty-Tz)/(Ty+Tz)$$

In the expression, Tz represents the transmittance of the polarized light in the absorption axis direction of the anisotropic colorant film, and Ty represents the transmittance of the polarized light in the polarizing axis direction of the anisotropic colorant film.

TABLE 1

| | | | | Examples | | | | Comparative | Reference |
|---|---|---|---|---|---|---|---|---|---|
| | | | Unit | 1 | 2 | 3 | 4 | Example 1 | Example |
| Configuration | Cured resin layer | Thickness | μm | 3 | 3 | 3 | 3 | 3 | 5 + 10 |
| | Base film | | — | PET | PET | PET | PET | PET | PET |
| | | Thickness | μm | 75 | 50 | 50 | 50 | 75 | 75 |
| | Presence of ultraviolet ray absorbent | | | yes | yes | yes | yes | no | yes |
| | Thickness ratio (base film/cured resin layer) | | — | 25 | 17 | 17 | 17 | 25 | 5 |
| Evaluation | Ultraviolet ray absorbing capability | | | | | | | | |
| | Average transmittance at 300 to 430 nm | | % | 30 | 5.8 | 1.7 | 16.2 | 6 | 30 |
| | Light transmittances at wavelengths | | | | | | | | |
| | 380 nm | | % | 2.6 | 0.3 | 0.7 | 0.03 | 87 | 2.6 |
| | 410 nm | | % | 91 | 7 | 3 | 58 | 89 | 91 |
| | 430 nm | | % | 92 | 65 | 18 | 75 | 90 | 92 |
| | b-Value | | — | 0.5 | 7.6 | 21.6 | 5.7 | 0.5 | 0.5 |
| | Surface hardness | | — | H | H | H | H | H | 5H |
| | Flex resistance | | | | | | | | |
| | Flex radius | R | mm | 2 | 2 | 2 | 2 | 2 | 2 |
| | Flex number of times | 200,000 times | | A | A | A | A | A | B |

TABLE 2

| | | | Unit | Example 5 | Comparative Example 2 |
|---|---|---|---|---|---|
| Configuration | Cured resin layer | Thickness | μm | 3 | 3 |
| | Base film | | — | PET | PET |
| | | Thickness | μm | 75 | 75 |
| | Presence of ultraviolet ray absorbent | | — | yes | no |
| | Adhesive layer | | μm | 50 | 50 |
| Evaluation | Protection capability of liquid crystal polarizing film | | | | |
| | Change of polarization degree after test | | % | 0.3 | 4.8 |

It was confirmed from the examples that the laminated film and the surface protection film of the present invention reduced the change of the polarization degree in irradiation of an ultraviolet ray and suppressed the light deterioration of the optical component, such as the liquid crystal polarizing film, due to the average value of the light transmittances of 35% or less at 300 to 430 nm.

REFERENCE SIGN LIST

1: Cured resin layer
2: Base film
3: Adhesive layer
4: Liquid crystal polarizing film (polarizing element)
**4*a***: Optically anisotropic layer

4*b*: Orientation membrane
5*a*, 5*b*: Adhesion layer or adhesive layer
6: Phase difference film
7: Organic EL light emitting layer
10: Lamination film
20: Surface protection film
100: Organic EL device

The invention claimed is:

1. A laminated film suitable for a liquid crystal polarizing film, the laminated film comprising:
a base film; and
a cured resin layer formed from a curable resin composition,
wherein the laminated film has an average value of light transmittances at 300 to 430 nm of 35% or less,
wherein the base film is a polyester film, and
the laminated film satisfies the following properties:
(i) the surface of the cured resin layer side has a surface pencil hardness of H or more obtained according to JIS K5600-5-4:1999 under a load condition of 750 g,
(ii) the cured resin layer has a thickness of from 1 μm to 4 μm, and
(iii) the laminated film has a thickness ratio (base film)/(cured resin layer) of 15 or more.

2. The laminated film of claim 1, wherein the base film comprises an ultraviolet ray absorbent.

3. The laminated film of claim 2, wherein the ultraviolet ray absorbent comprises at least one selected from the group consisting of a triazine-based ultraviolet ray absorbent, a benzotriazole-based ultraviolet ray absorbent, and a benzoxazine-based ultraviolet ray absorbent.

4. The laminated film of claim 1, wherein the curable resin composition comprises a (meth)acrylate and a modifier.

5. The laminated film of claim 1, wherein the laminated film does not crack in a 200,000 times bending test under a condition of R=2 mm.

6. The laminated film of claim 1, wherein the polyester film comprises a three-layer structure.

7. The laminated film of claim 6, wherein the intermediate layer of the polyester film comprises the ultraviolet ray absorbent.

8. The laminated film of claim 1, wherein the base film has a thickness of 9 μm or more and 125 μm or less.

9. The laminated film of claim 1, wherein the laminated film has a b-value of 6.0 or less as measured in accordance with JIS Z8722: 2009 by transmission method.

10. The laminated film of claim 1, wherein the laminated film has a light transmittance at 410 nm of 57% or more.

11. A surface protection film suitable for a liquid crystal polarizing film, comprising:
the laminated film of claim 1, having the cured resin layer provided on one surface of the base film and an adhesive layer provided on the other surface thereof.

12. The surface protection film of claim 11, wherein the adhesive layer comprises a (meth)acrylic-based polymer (A).

13. The surface protection film of claim 11, wherein the adhesive layer comprises a curable compound (B) and a radical polymerization initiator (C).

14. The surface protection film of claim 11, wherein the adhesive layer has a thickness of 10 μm or more and 175 μm or less.

15. A protection film combination, comprising:
the surface protection film of claim 11 and a release film, which are laminated on each other.

16. A laminate combination, comprising:
the laminated film of claim 1 or a surface protection film suitable for a liquid crystal polarizing film comprising the laminated film, having the cured resin layer provided on one surface of the base film and an adhesive layer provided on the other surface thereof; and
a liquid crystal polarizing film,
wherein the laminated film or the surface protection film and the liquid crystal polarizing film are laminated on each other.

17. The laminate combination of claim 16, wherein the liquid crystal polarizing film comprises an optically anisotropic layer.

18. The laminate combination of claim 16, wherein the liquid crystal polarizing film comprises an optically anisotropic layer and an orientation membrane.

19. The laminate combination of claim 17, wherein the optically anisotropic layer comprises a polymerizable liquid crystal compound.

20. The laminate combination of claim 17, wherein the optically anisotropic layer comprises a polymerizable liquid crystal compound and a colorant.

21. The laminate combination of claim 16, wherein the liquid crystal polarizing film has a thickness (total thickness) of ⅕ or less of a thickness of the base film.

22. The laminate combination of claim 16, wherein the laminate has a change rate of polarization degree at a wavelength of 595 nm of 4.0% or less after a test with a xenon light resistance tester, with a Ci400 device name, available from Atlas Testing Solutions, under an irradiation condition of an illuminance of 0.55 $W/m^2$ at 340 nm for 40 hours.

23. An image display apparatus, comprising:
the laminate combination of claim 16.

* * * * *